(12) United States Patent
Ho et al.

(10) Patent No.: US 11,749,570 B2
(45) Date of Patent: Sep. 5, 2023

(54) ETCH MONITORING AND PERFORMING

(71) Applicant: TAIWAN SEMICONDUCTOR MANUFACTURING COMPANY, LTD., Hsinchu (TW)

(72) Inventors: Wei-De Ho, Hsinchu (TW); Pei-Sheng Tang, Taipei (TW); Han-Wei Wu, Tainan (TW); Yuan-Hsiang Lung, Hsinchu (TW); Hua-Tai Lin, Hsinchu (TW); Chen-Jung Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 42 days.

(21) Appl. No.: 17/462,569

(22) Filed: Aug. 31, 2021

(65) Prior Publication Data
US 2023/0062426 A1    Mar. 2, 2023

(51) Int. Cl.
*H01L 21/66* (2006.01)
*H01L 21/02* (2006.01)
*H01J 37/32* (2006.01)
*G03F 7/00* (2006.01)

(52) U.S. Cl.
CPC .......... *H01L 22/12* (2013.01); *G03F 7/70633* (2013.01); *H01J 37/32009* (2013.01); *H01J 37/32449* (2013.01); *H01L 21/02252* (2013.01)

(58) Field of Classification Search
None
See application file for complete search history.

(56) References Cited

U.S. PATENT DOCUMENTS

| 8,962,400 | B2 | 2/2015 | Tsai et al. |
| 9,093,514 | B2 | 7/2015 | Tsai et al. |
| 9,093,530 | B2 | 7/2015 | Huang et al. |
| 9,105,490 | B2 | 8/2015 | Wang et al. |
| 9,171,929 | B2 | 10/2015 | Lee et al. |
| 9,214,555 | B2 | 12/2015 | Oxland et al. |
| 9,236,267 | B2 | 1/2016 | De et al. |

(Continued)

OTHER PUBLICATIONS

Charlie Chen et al., "Device-correlated metrology for overlay measurements," Journal of Micro/Nanolithography, MEMS and MOEMS, 13(4), 041404-1 to 041404-6 (Oct.-Dec. 2014).

*Primary Examiner* — Roberts P Culbert
(74) *Attorney, Agent, or Firm* — McDermott Will & Emery LLP

(57) ABSTRACT

In a method of patterning an integrated circuit, test layer thickness variation data is received when a test layer with a known thickness disposed over a test substrate undergoes tilted angle plasma etching. Overlay offset data per substrate locations caused by the tilted angle plasma etching is determined. The overlay offset data is determined based on the received thickness variation data. The overlay offset data is associated with an overlay between first circuit patterns of a first layer on the semiconductor substrate and corresponding second circuit patterns of a second layer disposed over the first layer on the substrate. A location of the substrate is adjusted based on the overlay offset data during a lithography operation to pattern a resist layer over the second layer. The second layer is patterned based on the projected layout patterns of the reticle and using the tilted angle plasma etching.

20 Claims, 18 Drawing Sheets

(56) References Cited

U.S. PATENT DOCUMENTS

| | | | |
|---|---|---|---|
| 9,236,300 B2 | 1/2016 | Liaw | |
| 9,245,805 B2 | 1/2016 | Yeh et al. | |
| 9,406,804 B2 | 8/2016 | Huang et al. | |
| 9,418,897 B1 | 8/2016 | Ching et al. | |
| 9,443,769 B2 | 9/2016 | Wang et al. | |
| 9,520,482 B1 | 12/2016 | Chang et al. | |
| 9,548,303 B2 | 1/2017 | Lee et al. | |
| 9,548,366 B1 | 1/2017 | Ho et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,812,363 B1 | 11/2017 | Liao et al. | |
| 9,831,183 B2 | 11/2017 | Lin et al. | |
| 9,859,380 B2 | 1/2018 | Lee et al. | |
| 9,859,386 B2 | 1/2018 | Ho et al. | |
| 2018/0090370 A1 | 3/2018 | Hung et al. | |
| 2019/0285992 A1* | 9/2019 | Van Haren | G03F 7/70625 |
| 2022/0102118 A1* | 3/2022 | Chang | H01L 21/6833 |

* cited by examiner

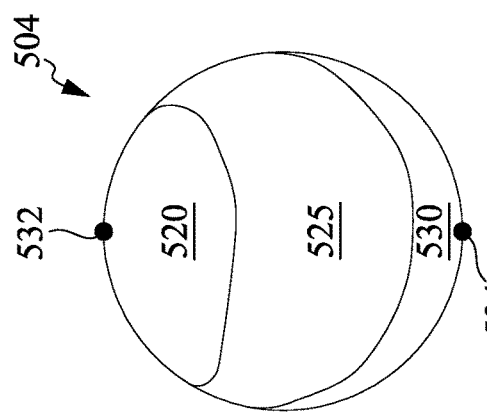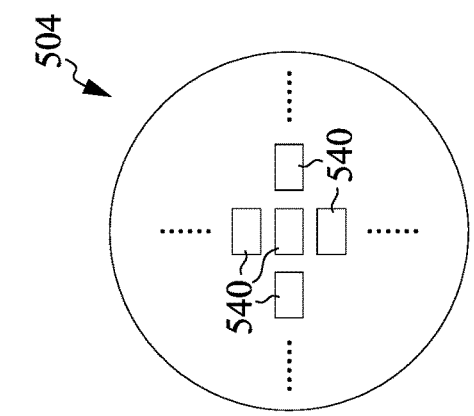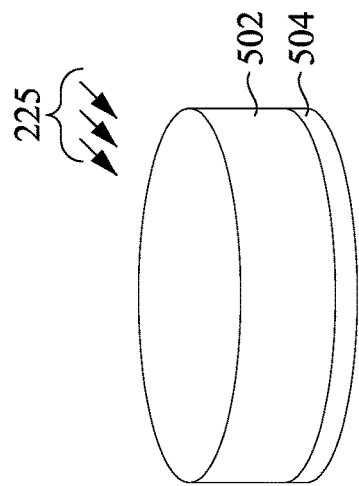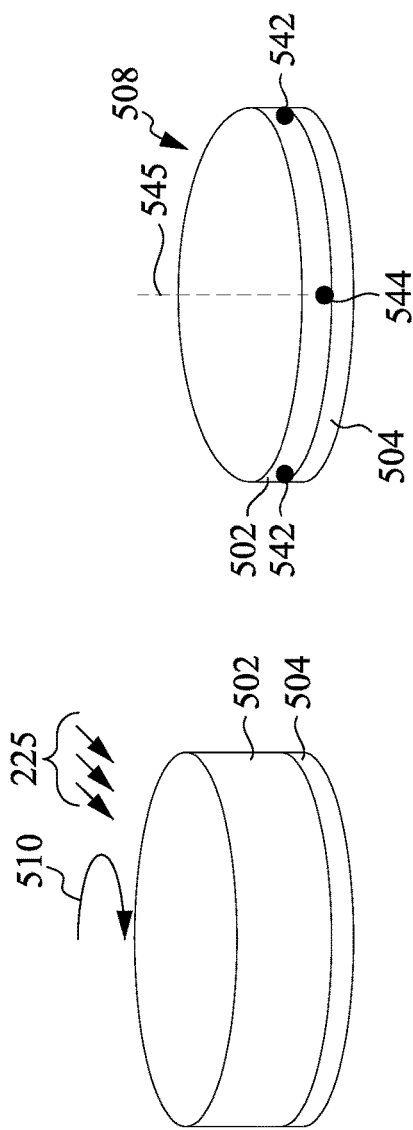

ETCH MONITORING AND PERFORMING

BACKGROUND

During an integrated circuit (IC) design, a number of layout patterns of the IC, for different steps of IC processing, are generated on a substrate. The layout patterns include geometric shapes corresponding to structures to be fabricated on the substrate. The geometric shapes may be produced by plasma etching, e.g., by plasma etching with a plasma beam, of a top layer on the substrate to produce the shapes. In addition, the shapes may be fine-tuned by tilted angle plasma etching. Therefore, it is desirable to control the etching locations to produce exact shapes and locations of the patterns at the top layer on the substrate.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A, 5B, 5C, 5D, 5E, 5F, and 5G show a target layer to be patterned or etched disposed over a semiconductor substrate before and after undergoing a tilted angle plasma etching, a map of the thickness of the target layer after being etched, regions where layout patterns of the photo mask are projected on the wafer, and a film thickness measurement system for measuring the thickness of the target layer in accordance with some embodiments of the present disclosure.

DETAILED DESCRIPTION

Figure 1A:
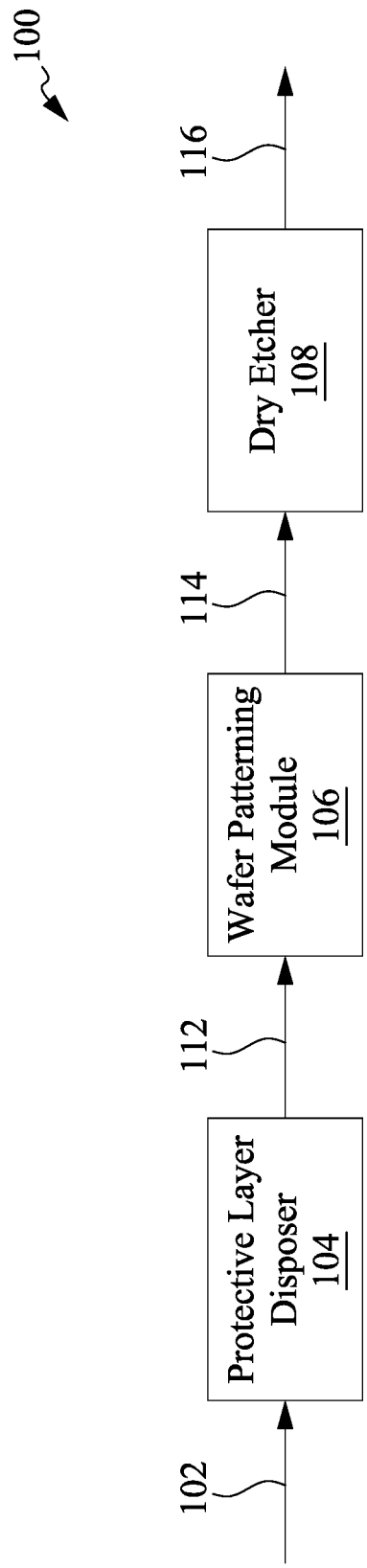
FIGS. 1A and 1B show a process for patterning and etching a semiconductor device and a schematic view of a lithography system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In a plasma etching process, one or more etching gases are provided to a plasma etcher, e.g., a plasma etching device. The etching gas is converted into a plasma inside the plasma etcher and the converted plasma is directed as a plasma beam to a substrate for plasma etching. In some embodiments, the intensity of the plasma beam is determined, e.g., calculated or adjusted, based on a flow rate of the etching gas that enters the plasma etcher. Therefore, the intensity of the plasma beam is controlled by adjusting the flow rate of the etching gas that enters the plasma etcher.

In some embodiments, the plasma etcher includes an etch control circuit and the etch control circuit applies an electric field or applies a magnetic field to the plasma beam to induce a tilted angle to the plasma beam and, thus, the plasma etcher can produce tilted angle plasma etching (e.g., tilted angle plasma etching). The plasma beam that includes charged particles, e.g., charged ions, experience more divergence when the plasma beam gets further away from the plasma beam generator of the plasma etcher. In some embodiments, the divergence of the plasma beam is more profound for the plasma beams with tilted angle because the divergence may depend on a distance between the plasma beam generator and the location of the substrate that is being etched. Thus, during a tilted angle plasma etching the etched locations on the substrate that are farther from the plasma beam generator receive a more divergent plasma beam compared to the locations on the substrate that are closer to the plasma beam generator. Therefore, the etch rate caused by the plasma beam may depend on the distance between the etched location of the substrate to the plasma beam generator. In some embodiments, the etched locations of the substrate that are farther from the plasma beam generator undergo a lower etch rate compared to the etched locations of the substrate that are closer to the plasma b beam generator and, thus, produce a non-uniform etch rate.

In some embodiments, producing different etch rates at different etched locations of upper layer disposed on a lower layer causes overlay-measurement offset (i.e., a measurement error) between circuit patterns of the upper layer and circuit patterns of the lower layer. It is highly desirable to take into account the effects of the non-uniform etching when producing the circuit patterns of the upper layer during the lithography and/or etching operations and moving the substrate, based on the overlay offset data, during the lithography and/or etching operations. As noted, the overlay offset errors may be at least partially caused by the non-uniform etch rate. In some embodiments, a uniform first layer of oxide, e.g., silicon oxide, or a uniform first layer of a semiconductor, e.g., a silicon layer, is disposed over a substrate. The first layer over the substrate is etched by the plasma etcher. The remaining part of the first layer is measured in a film thickness measurement operation and the thickness of the remaining first layer is determined. Based on the determined thickness of the remaining first layer, the non-uniform etch rate is determined, e.g., calculated. In some embodiments, the first layer is a non-uniform test layer with a known thickness.

Figure 1B:
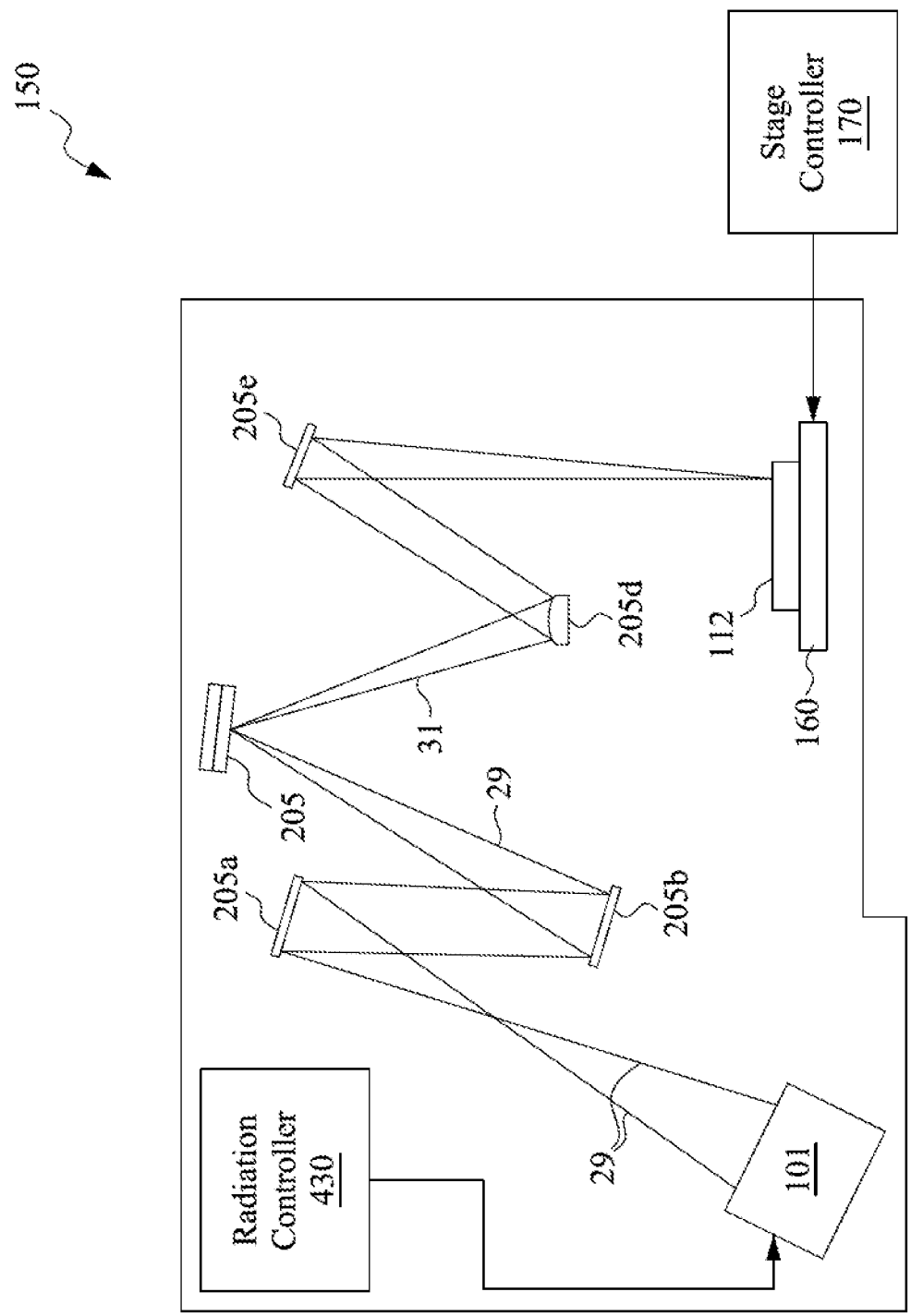

FIGS. 1A and 1B show a process 100 for patterning and etching a semiconductor device and a schematic view of a lithography system 150. FIG. 1A shows that a protective layer is disposed over a base substrate 102 by a protective layer disposer 104 to generate a substrate 112. In some embodiments, a target layer to be patterned or etched is formed on the base substrate 102 and the protective layer is formed over the target layer. In some embodiments, the protective layer is a soft mask, e.g., a photoresist layer and is coated by a resist coater. In some embodiments, instead of a photoresist material, the protective layer is made of a hard mask layer of a material used in semiconductor processing as an etch mask and the hard mask layer that is deposited by chemical vapor deposition (CVD). In some embodiments, the hard mask used for plasma etching process is an insulating material, such as, silicon oxide, silicon nitride, SiON, silicon carbide (SiC), tantalum pentoxide ($Ta_2O_5$), aluminum oxide or aluminum nitride (AlN). In other embodiments, the hard mask is made of amorphous silicon, polysilicon, titanium nitride or any other conductive material. In some embodiments, the soft mask or the hard mask is patterned by a wafer patterning module 106, and portions of the soft mask or the hard mask are removed to create a pattern in the soft mask or the hard mask. Thus, the wafer patterning module 106 generates a pattern-masked substrate 114. The pattern-masked substrate 114 is etched by a dry etcher 108, e.g., a plasma etcher, and the layer under the removed portions of the soft mask or the hard mask are etched while the remaining portions of the soft mask or the hard mask is used to prevent etching. The dry etcher 108 produces an etched substrate 116. The process 100 is described in more details with respect to FIGS. 2A, 2B, 2C, and 2D.

FIG. 1B shows a schematic view of the lithography system 150 for generating a resist pattern on a wafer. The lithography system 150 shows the exposure of substrate 112 with a patterned beam 31, such as ultraviolet (UV) light or extreme UV (EUV) light. The lithography system 150 may include a wafer movement device, e.g., a stage 160, a stepper, a scanner, a step and scan system, a direct write system, a device using a contact and/or proximity mask, etc., provided with one or more optics 205a, 205b, for example, to illuminate a patterning optic, such as a reticle, e.g., a reflective mask 205 with a radiation beam 29, with a radiation beam, e.g., a UV radiation beam or an EUV radiation beam. The illumination of the patterning optics may produce a patterned beam 31, and one or more reduction projection optics 205d, 205e, of the optical system for projecting the patterned beam 31 onto the substrate 112. A stage controller 170 may be coupled to the wafer movement device, e.g., a stage 160, for generating a controlled relative movement between the substrate 112 and the patterning optic, e.g., a reflective mask 205. By the controlled relative movement, different dice of the substrate 112 are patterned.

As further shown, the lithography system 150 of FIG. 1B includes a radiation source 101 to generate the radiation beam 29 used to irradiate a resist layer on top of the substrate 112. In some embodiments, because gas molecules absorb EUV light, when the radiation source 101 is an EUV radiation source, the lithography system 150, when operated, is maintained under a vacuum environment to avoid EUV intensity loss. In addition, the lithography system 150 includes a radiation controller 430 to control an intensity of the radiation beam 29. In some embodiments, the radiation controller 430 adjusts the radiation by adjusting a projection time of the lithography operation to pattern the resist layer and to provide a critical dimension (CD) uniformity (CDU) within a threshold value, e.g., a CDU between 1-2 percent uniformity for 5 nm CD.

In some embodiments, other processes performed prior and/or subsequent to a lithography operation, may produce an overlay offset between the circuit patterns produced in the soft mask or the hard mask layer on top of the substrate 112 and other circuit patterns already disposed in other layers below the soft mask or the hard mask layer. Thus, in some embodiments, the stage controller 170 moves the substrate 112 by an amount of the overlay offset measured using a test wafer or a first-processed wafer, prior to the lithography operation for the remaining wafers to compensate the overlay offset that is produced in one or more processes.

FIGS. 2A, 2B, 2C, and 2D show a schematic diagram of steps of etching a substrate in accordance with some embodiments of the present disclosure. FIGS. 2A, 2B, 2C, and 2D are consistent with the substrates produced by the patterning and etching process 100 of FIG. 1A. It is understood that additional operations can be provided before, during, and after processes shown by FIGS. 2A-2D, and some of the operations described below can be replaced or eliminated, for additional embodiments of the method. The order of the operations/processes may be interchangeable.

Figure 2A:
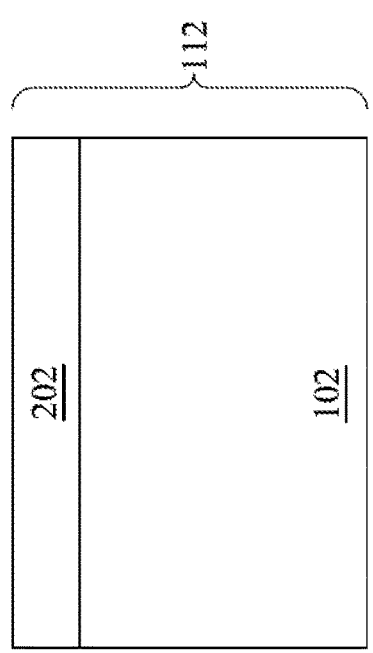
FIGS. 2A, 2B, 2C, and 2D show a schematic diagram of steps of etching a substrate in accordance with some embodiments of the present disclosure.
Figure 2B:
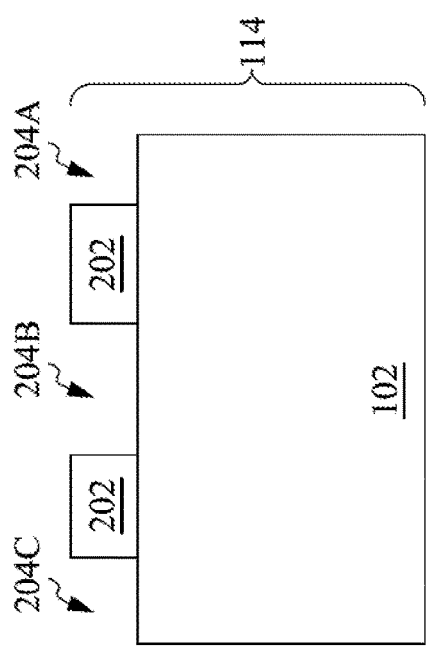
Figure 2C:
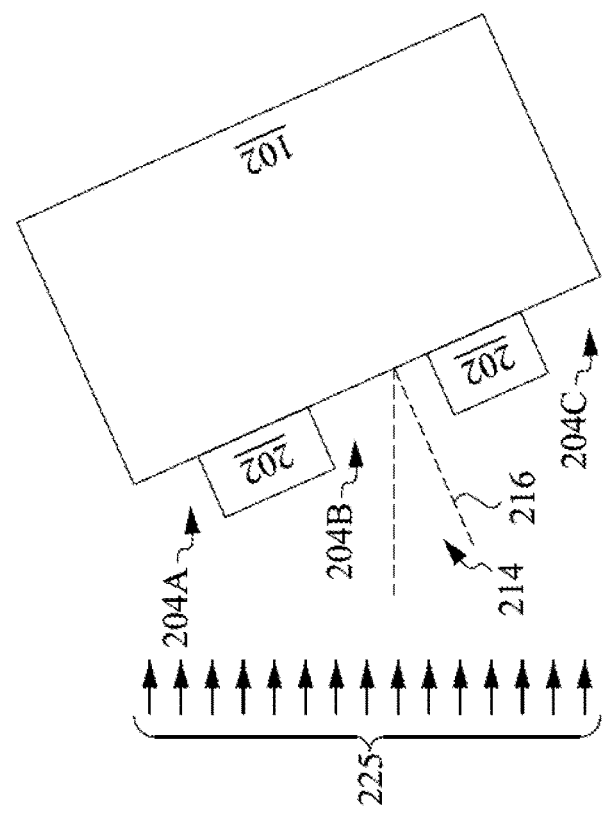
Figure 2D:
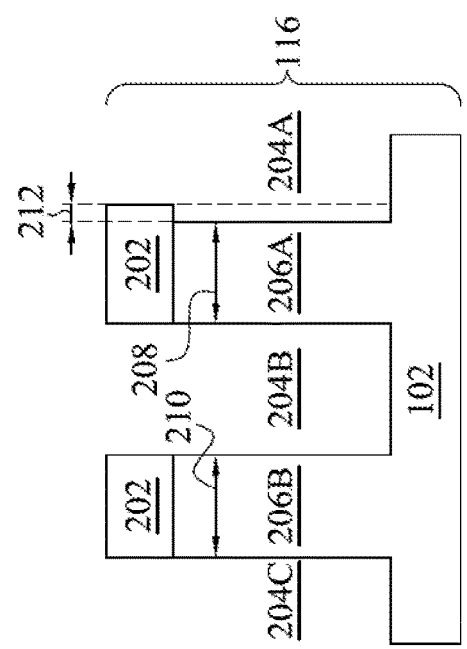

FIG. 2A shows the substrate 112, e.g., a wafer of FIG. 1A with a base substrate 102 (or a target layer to be patterned) and a mask layer 202, e.g., a hard mask layer or a soft mask layer, disposed over the base substrate 102. The mask layer 202 is disposed by the protective layer disposer 104. The substrate 112 is patterned in a lithography operation by the wafer patterning module 106 and the pattern-masked substrate 114 is produced. As shown in FIG. 2B, the openings 204A, 204B, and 204C are produced in the mask layer 202. As shown in FIG. 2C, the pattern-masked substrate 114 is bombarded with a plasma beam 225 of a dry etcher consistent with the dry etcher 108 of FIG. 1A. The plasma beam 225 has an angle 214 with the perpendicular line 216 to the surface of the pattern-masked substrate 114 and, thus, the dry etcher performs a tilted angle plasma etching of the pattern-masked substrate 114 and the etched substrate 116 is produced. The plasma etching is performed for a predetermined amount of time and as shown in FIG. 2D, openings 204A, 204B, and 204C extend into the base substrate 102 of the etched substrate 116. In addition, the etched patterns, for example, fins 206A and 206B used for a fin field effect transistor (FinFET), are produced under the remaining mask layer 202. As shown in FIG. 2D, in some embodiments, a width 208 of the fin 206A is smaller than a width 210 of the fin 206B and a bias 212 is produced between the fin 206A and the remaining mask layer 202 over the fin 206A. In some embodiments, however, there is substantially no bias between the fin 206B and the remaining mask layer 202 over the fin 206B. In some embodiments, the openings 204A, 204B, and 204' are trenches and a trench closer to the plasma beam 225 experiences a higher etch rate and, thus, the bias 212 (e.g., an offset) is produced. Consequently, in some embodiments, the trench closer to the plasma beam has higher depth. In some embodiments, the bias 212 is between 1 nm and 3 nm.

As shown in FIG. 2B. In some embodiments, the protective mask layer 202 is a photo resist layer. In some embodiments, the protective mask layer 202 is a hard mask layer described above. As shown in FIG. 2B, the protective mask layer 202 is patterned and the openings 204A, 204B, and 204C are produced in the protective mask layer 202 that exposes the base substrate 102 and produces the pattern-masked substrate 114. When the protective layer is a photo resist layer, the openings 204A, 204B, and 204C are produced by a lithographic process of imaging a photo mask, developing the photo resist layer, and removing the photo resist in the openings 204A, 204B, and 204C. When the protective mask layer 202 is a hard mask, a photo resist layer (not shown) is coated on top of the protective mask layer 202. The photo resist layer is patterned and the photo resist layer over the openings 204A, 204B, and 204C is removed by the lithographic process described above. Then, the openings 204A, 204B, and 204C are created in the protective mask layer 202 by one or more etching operations.

Figure 3A:
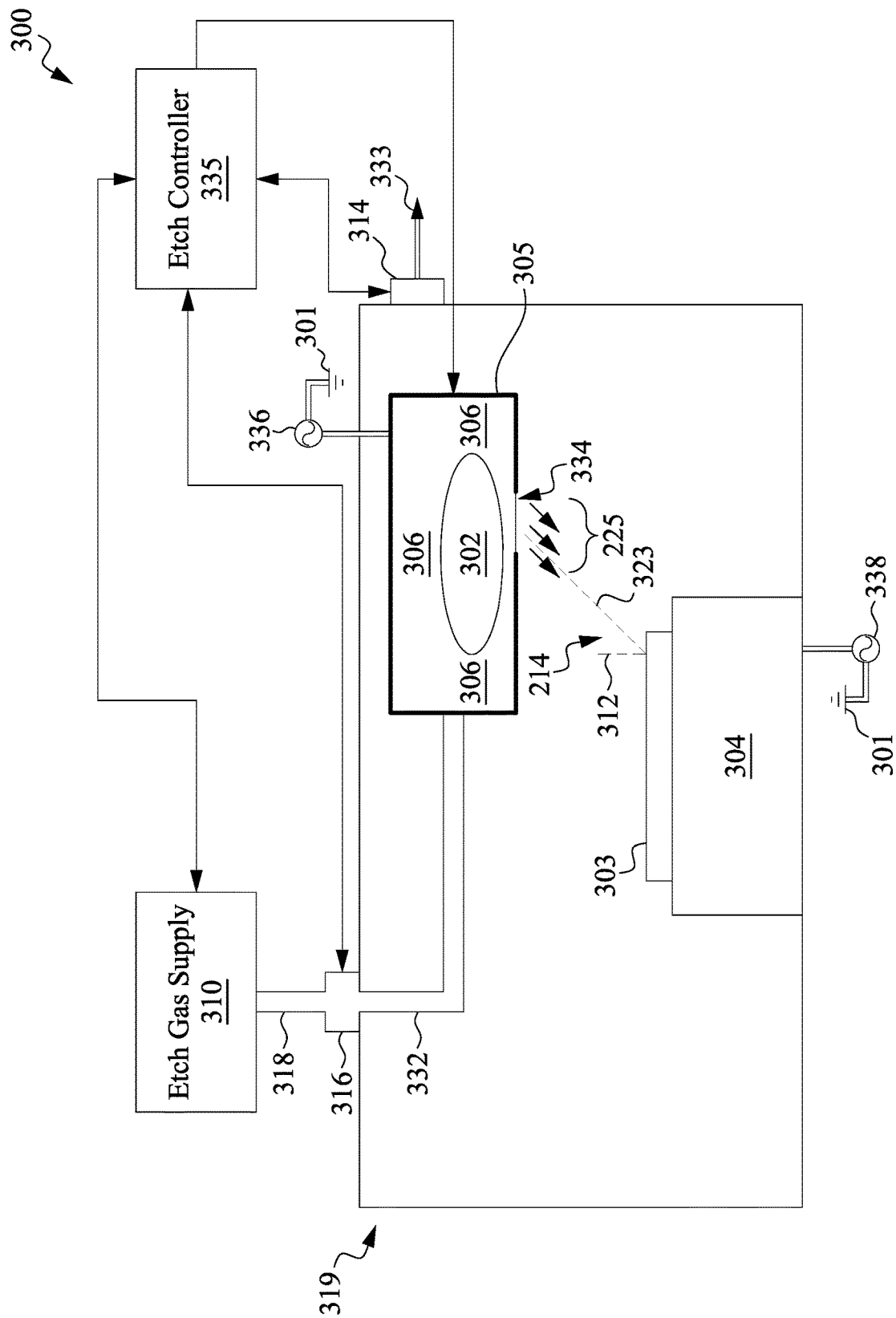
FIGS. 3A, 3B, and 3C show a schematic diagram of a plasma etching system and schematic diagrams of tilted angle plasma etching in accordance with some embodiments of the present disclosure.
Figure 3C:
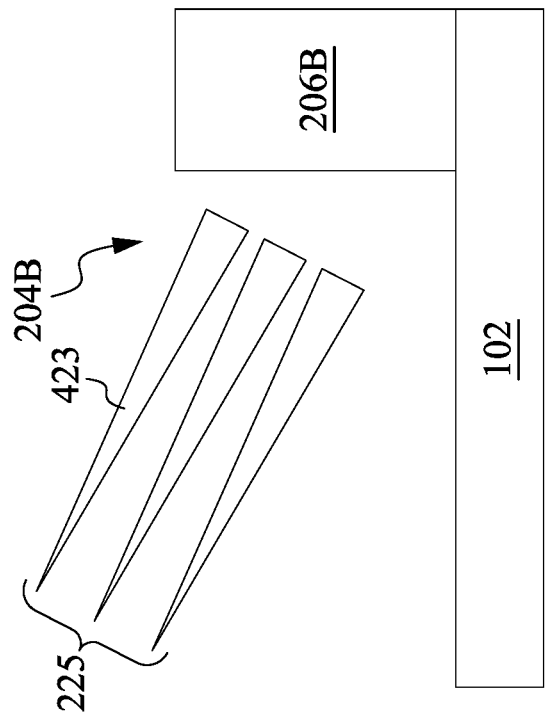
Figure 3B:
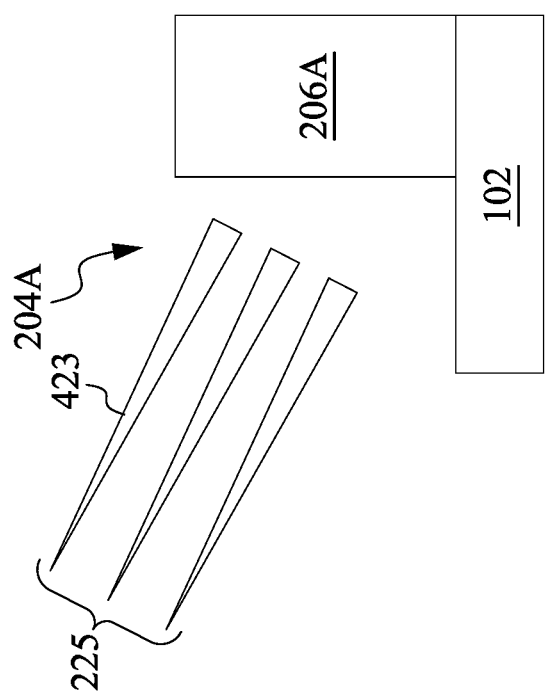

FIGS. 3A, 3B, and 3C show a schematic diagram of a plasma etching system and schematic diagrams of tilted angle plasma etching in accordance with some embodiments of the present disclosure. FIG. 3A shows a schematic diagram of a plasma etching system 300. The plasma etching system 300 includes a plasma etcher 319 having a plasma etching chamber 320 therein. The plasma etcher 319 includes a plasma beam generator 305 that includes a plasma cavity 302 and an electric-control circuit 306 around the plasma chamber. The plasma beam generator 305 is connected via a voltage source 336 to a ground 301. The plasma beam generator 305 is connected via a pipe 332 to a flow rate controller 316, e.g., an adjustable valve, of the plasma etcher 319. The flow rate controller 316 is connected via a pipe 318 to an etch gas supply 310 of the plasma etching system 300. The etch gas supply 310 contains an etching gas that includes one or a combination of the gasses $O_2$, $C_xF_y$, e.g., $C_3F_8$, $C_xH_yF_z$, e.g., $CH_3F_8$, Ar, $N_2$, $H_2$, CO, $CO_2$, $B_xCl_y$, $Cl_2$, $NH_3$, $N_xF_y$, HBr, or $CH_4$. The etch gas supply 310, the flow rate controller 316, and the plasma beam generator 305 are connected to an etch controller 335, e.g., an etch control circuit, of the plasma etching systems 300 and are controlled by the etch controller 335. The etch controller 335 commands the etch gas supply 310 to release etching gas of the etch gas supply 310 through the pipe 318 to the flow rate controller 316. The etch controller 335 commands the flow rate controller 316 to allow a predefined flow rate of the etching gas, determined by the etch controller 335, to go through the pipe 332 to the plasma beam generator 305. The etch controller 335 commands the electric-control circuit 306 of the plasma beam generator 305 to apply a high voltage in the plasma cavity 302 and generate the plasma beam 225 from the etching gas in the plasma beam generator 305. The plasma beam 225 leaves the plasma beam generator 305 from an opening 334 of the plasma beam generator 305.

The plasma etcher 319 also includes a stage 304 and the stage 304 holds a substrate 303 consistent with the pattern-masked substrate 114. The stage 304 is connected via a voltage source 338 to the ground 301. In addition, the stage 304 is also connected to the etch controller 335. In some embodiments, as shown in FIG. 3A, the etch controller 335 commands the stage 304 and electric-control circuit 306 of the plasma beam generator 305 to make the plasma beam 225 leave the plasma beam generator 305 in a direction 323 having a tilted angle with the surface of the substrate 303. In some embodiments, the electric-control circuit 306 of the plasma chamber applies an electric filed or a magnetic field to the plasma beam 225 to induce the direction 323 for the plasma beam 225. In some embodiments, instead of applying the electric field or the magnetic field to produce the tilted angle plasma etching, as shown in FIG. 2C, the substrate is rotated (tilted) by a predefined angle, e.g., the angle 214, with respect to when the plasma beam 225 is perpendicular to the surface of the base substrate 102. FIG. 3A also shows the angle 214 of the direction of the plasma beam 225 (the tilted angle beam) and a perpendicular line 312 to the surface of the substrate 303. In some embodiments, the angle 214 is between 60 degrees and 150 degrees.

The plasma etcher 319 also includes an adjustable valve 314 that is connected to the etch controller 335 and is controlled by the etch controller 335. An exit gas 333 of the plasma etcher 319 leaves the plasma etcher 319 via the adjustable valve 314. In some embodiments, the exit gas 333 is the etching gas that is discharged. In some embodiments, the exit gas 333 is pump purged out of the plasma etching chamber 320 by a pump (not shown) that is coupled to the adjustable valve 314 for drawing the exit gas 333.

FIGS. 3B and 3C show schematic diagrams of tilted angle plasma etching. As shown, the plasma beam 225 includes a number of plasma rays (sub-beams) 423 that each ray includes a number of ions. Thus, the farther the plasma beam 225 gets from the plasma beam generator 305, the plasma rays 423 become divergent and less focused, e.g., because the ions of the plasma rays 423 repel each other and the divergence increase as the plasma rays get farther from the opening 334 of the plasma beam generator 305. As the plasma rays become less focused, i.e., a density of active species (ions) decreases, the etch rate produced by the plasma beam 225 is reduced. Thus, as shown in FIGS. 2C, 3B, and 3C, the plasma beam 225 in the opening 204A (e.g., a trench) that is closer to the plasma beam generator 305 produces a higher etch rate than in the opening 204B (e.g., a trench) that is farther from the plasma beam generator 305. In some embodiments, the divergence of each ray 423 at a distance of 30 cm from the plasma beam generator 305 is between 0.5 nm to 0.75 nm.

Figure 4C:
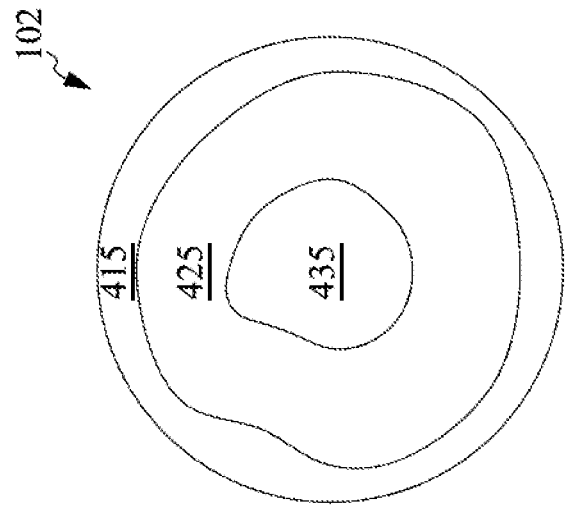
FIGS. 4A, 4B, 4C, 4D, 4E, 4F, and 4G show circuit patterns of a lower layer and circuit patterns of a corresponding upper layer and an etch rate map of the tilted angle plasma etching in accordance with some embodiments of the present disclosure.
Figure 4A:
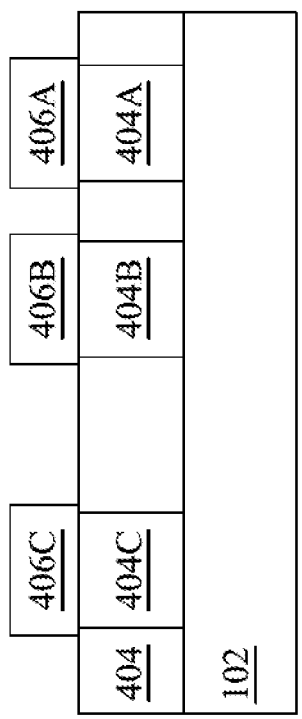

FIGS. 4A, 4B, 4C, 4D, 4E, 4F, and 4G show circuit patterns of a lower layer and circuit patterns of a corresponding upper layer and an etch rate map of the tilted angle plasma etching in accordance with some embodiments of the present disclosure. FIG. 4A shows a first layer 404 disposed over the base substrate 102 in a first process. In the first layer 404, three structures 404A, 404B, and 404C (e.g., trenches) are produced by one of wet etching, plasma etching, or a combination thereof. A group of three structures are disposed in the three structures 404A, 404B, and 404C (e.g., trenches) as part of the circuit patterns of the lower layer. In a second process, a second layer is disposed over the first layer 404 and then second group of three structures 406A, 406B, and 406C are produced over the first group of three structures 404A, 404B, and 404C as part of the circuit patterns of the upper layer.

Ideally, the second group of three structures 406A, 406B, and 406C are perfectly aligned to the first group of three structures 404A, 404B, and 404C, respectively, or an overlay error between the second group and the first group is smaller than a predetermined criterion. In some embodiments, the three structures 406A, 406B, and 406C are produced by the non-uniform tilted angle plasma etching. As shown, the arrows 410, 420, and 431 show the etch rate at different location of the second layer and the length of the arrows 410, 420, and 431 show the etch rates. Thus, the etch rate arrow 410 around the edge of the base substrate 102 is higher than the etch rate arrows 420 and 431 inside the base substrate 102. In some embodiments, the base substrate 102 is mounted on a stage, e.g., the stage 304 of FIG. 3A, and the stage rotates the base substrate 102 during the tilted angle plasma etching. As shown, in FIG. 4B, the etch rate increases around an edge of the base substrate 102 and the etch rate decrease around the center of the base substrate 102 in some embodiments and a non-uniform etching is produced. In addition, as shown, the width 408A, 408B, and 408C of the three structures 406A, 406B, and 406C, which should ideally be the same, are not equal to each other. In addition, different offsets, e.g., overlay offsets, are produced between the three structures 404A, 404B, and 404C (circuit patterns of the lower layer) and the three structures 406A, 406B, and 406C (circuit patterns of the upper layer). In some embodiments, the width 408A, 408B, or 408C is between 5 nm and 10 nm.

Figure 4B:
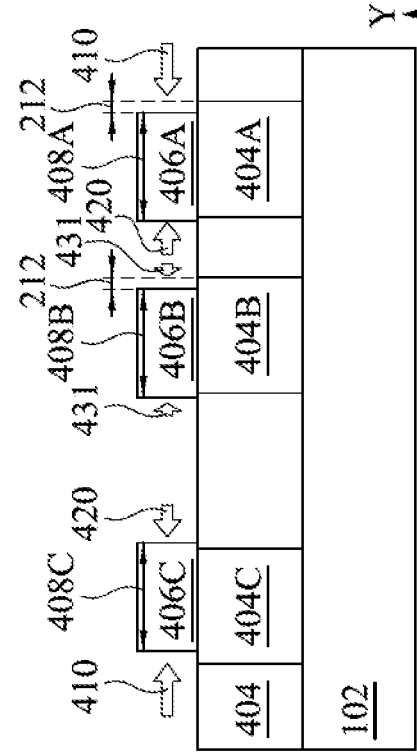

In addition, as shown in FIG. 4B, different overlay biases 212 are produced at different locations of the base substrate 102 and, thus, the overlay offset may depend on the location of base substrate 102. In some embodiments, when the circuit patterns of a photo mask (reticle) is imaged, e.g., projected, on the wafer in the lithography operation, the projected image covers one or more predetermined portions of the wafer. Thus, while in one portion of the wafer the overlay offset may be approximated as constant, the overlay offset may vary within the wafer. As shown, the overlay offsets in FIG. 4B are in the horizontal direction (X-direction) because the layout patterns are stretched in the in the Y-direction. In addition, the layout patterns may be stretched in the X-direction and, thus, may cause overlay offsets that are in the Y-direction. The offset variations within the wafer is described below with respect to FIGS. 5C and 5F.

FIG. 4C shows a map of regions 415, 425, and 435 of the base substrate 102, e.g., a wafer, having different etch rates. The region 415 corresponds to the highest etch rate arrow 410, the region 425 corresponds to the etch rate arrow 420 that is lower than the etch rate arrow 410, and the region 435 corresponds to the etch rate arrow 431 that is the lowest etch rate. In some embodiments, the regions 415, 425, and 435 gradually change. In some embodiments, the etch rate map of FIG. 4C corresponds to an overlay offset map between the upper layer and the lower layer after the upper layer undergoes tilted angle plasma etching. In some embodiments, in region 415 corresponding to the highest etch rate, an overlay offset between 2 nm and 3 nm is generated. In some embodiments, in region 435 corresponding to the lowest etch rate, an overlay offset between 0.5 nm and 1 nm is generated and in the region 425 an overlay offset between 1.5 nm and 2 nm is generated.

Figure 4E:
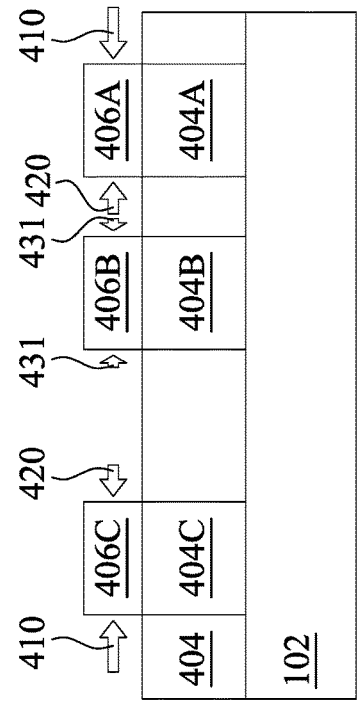
Figure 4G:
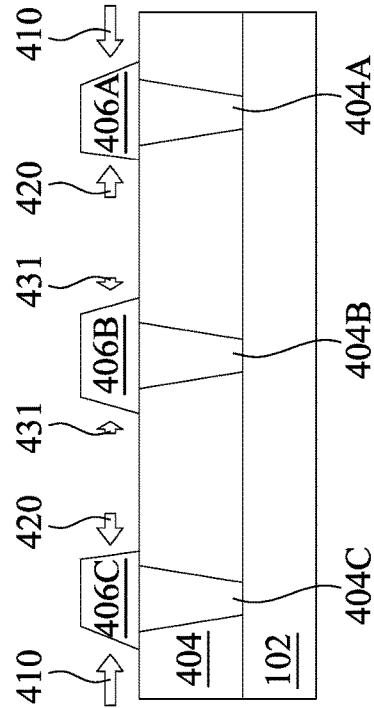
Figure 4D:
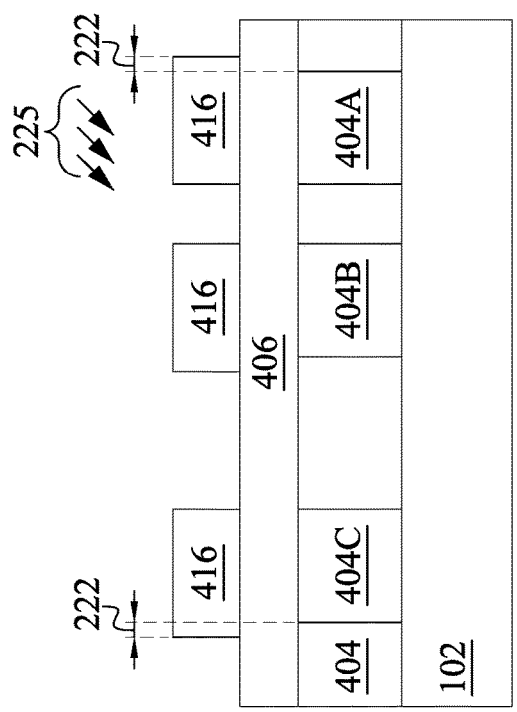

FIG. 4D is consistent with FIG. 4A with the difference that FIG. 4D the patterned hard mask 416 and the plasma beam 225 for etching, e.g., tilted angle plasma etching, a layer 406 and producing the structures 406A, 406B, and 406C. As shown, the hard mask has an offset 222 at locations receiving the highest etch rate arrow 410. In some embodiments, the substrate of FIG. 4D is mounted on a rotating stage during the etching operation. FIG. 4E is consistent with FIG. 4B and shows that by applying the offsets 222 during the lithography operation to produce the patterned hard mask 416, the offsets between the structures 406A, 406B, and 406C and the structures 404A, 404B, and 404C are corrected.

Figure 4F:
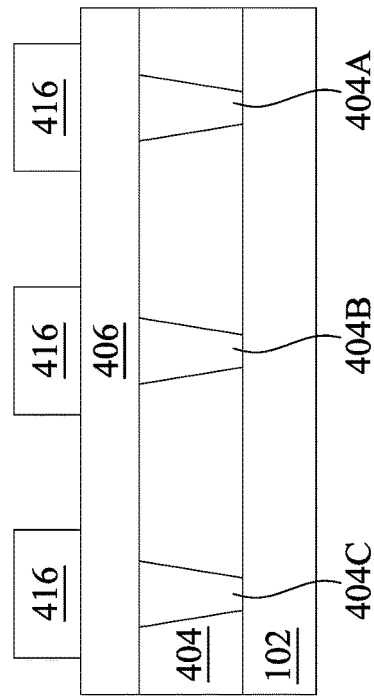

FIG. 4F is consistent with FIG. 4D with the difference that the structures 404A, 404B, and 404C are formed in openings that are produced by plasma etching and the etching rate is higher at the top of the openings compared with the bottom of the openings. FIG. 4G is consistent with FIG. 4E with the difference that the plasma etching produces a higher etching rate at the top of the structures 406A, 406B, and 406C compared to the bottom of the structures 406A, 406B, and 406C. As described, the plasma beam 225, e.g., the plasma rays 423 of the plasma beam 225, become more divergent and less focused as the plasma beam 225 gets farther from the opening 334 of the plasma beam generator 305 of FIG. 3A. In some embodiments, the more focused plasma beam 225 etches faster than the less focused plasma beam 225. Because the plasma beam 225 is closer to the top of the structures 406A, 406B, and 406C compared to the bottom of the structures 406A, 406B, and 406C, the plasma beam 225 is more focused at the top of the structures 406A, 406B, and 406C and, thus, the top of the structures 406A, 406B, and 406C are etched faster.

Figure 5G:
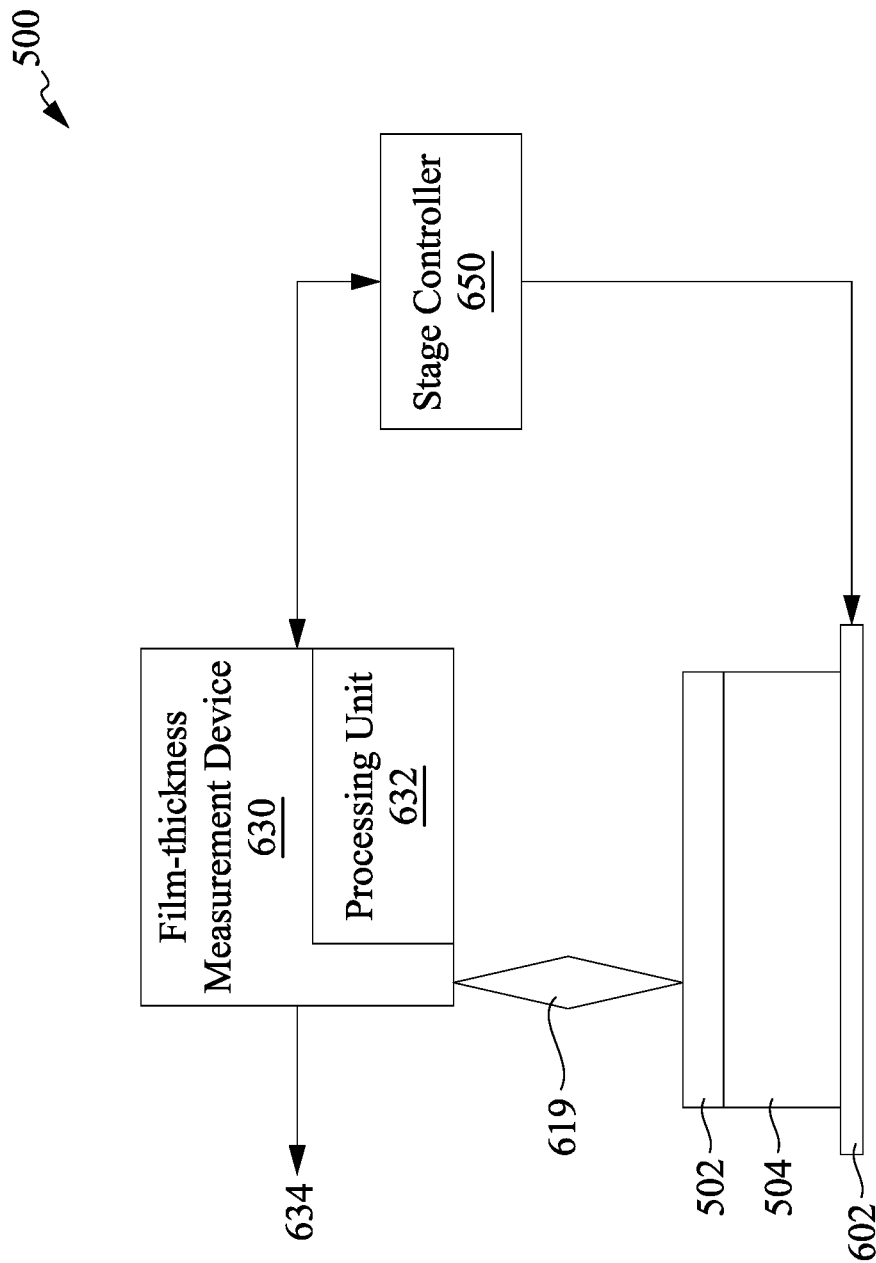

FIGS. 5A, 5B, 5C, 5D, 5E, 5F, and 5G show a target layer to be patterned or etched disposed over a semiconductor substrate before and after undergoing a tilted angle plasma etching, a map of the thickness of the target layer after being etched, and regions where layout patterns of the photo mask are projected on the wafer in accordance with some embodiments of the present disclosure. FIGS. 5A, 5B, 5C, 5D, 5E, and 5F show a wafer 504, e.g., a test wafer. As shown in FIG. 5A, a uniform film layer 502 is disposed over the wafer 504. In some embodiments, the layer 502 is a semiconductor layer, e.g., a silicon layer. In some embodiments, the layer 502 is an insulating layer, e.g., a silicon oxide layer or a metallic layer e.g., TiN, TaN or other metal or metal alloys. As shown in FIG. 5A, the wafer 504 with the uniform film layer 502 is etched with the plasma beam 225 and, thus, the wafer 504 with the uniform film layer 502 undergoes a tilted angle plasma etching. FIG. 5B shows the result of the tilted angle plasma etching on the wafer 504 with the uniform film layer 502. As shown, a non-uniform etching is produced on the film layer 502 and a top surface 506 of the etched film layer 502 is tilted. As shown in FIG. 5B, a thickness of the etched film layer 502 is inversely proportional to the etch rate of the tilted angle plasma etching. Thus, a region closest to the plasma beam 225 receives a highest etch rate and the thickness of the etched film layer 502 is the smallest and a region farthest from the plasma beam 225 receives a lowest etch rate and the thickness of the etched film layer 502 is the largest. As shown in FIG. 5C, the region 530 on the wafer 504 has the lowest remaining thickness of the etched film layer 502 with highest etch rate, the region 520 on the wafer 504 has the highest remaining thickness of the etched film layer 502 with lowest etch rate, and the region 525 has a moderate remaining thickness of the etched film layer 502 between thickness of the regions 520 and 530 and, thus, has a moderate etch rate between the etch rate of the regions 520 and 530. In some embodiments, the etch rate and the thickness of the etched film layer 502 gradually changes between the regions 520, 525, and 530. In some embodiments, the etch rate map of FIG. 5C corresponds to an overlay offset map between the upper layer and the lower layer after the upper layer undergoes tilted angle plasma etching.

FIG. 5D is consistent with FIG. 5A with the difference that when the wafer 504 is mounted on a stage, e.g., stage 304 of FIG. 3A, and the stage is rotated in a direction 510 during of the tilted angle plasma etching. FIG. 5E is consistent with FIG. 5B and although a non-uniform etching is produced, however, the non-uniformity, compared to FIG. 5B, is reduced. As shown, the lowest remaining thickness of the etched film layer 502 associated with the highest etch rate occurs around the edge of the wafer 504 and the highest remaining thickness of the etched film layer 502 associated with the lowest etch rate occurs around the center of the wafer 504. In some embodiments, an etch rate map of FIG. 5E is consistent with the map of FIG. 4C. In some embodiments, the stage is rotated opposite of the direction 510. FIG. 5F shows regions 540 of the wafer 504 where the layout patterns of the photo mask are projected at different projections when the wafer 504 is projected by the stage 160, the stepper, or the scanner described with respect to FIG. 1B. By comparing FIGS. 5C and 5F, it is shown that the different regions 540 experience different etching rates and, thus, experience different overlay offsets. As shown, in FIG. 5E, the wafer 504 is rotating around a central axis 545 of the wafer, e.g., a center of rotation of the wafer 504. As shown, the highest etch rate occurs at edge points 542 on the edge of the wafer 504 and the lowest etch rate occurs at a center point 544 at the center of the wafer. Because the wafer 504 in FIG. 5E is rotating compared to the wafer 504 in FIG. 5B that is stationary, e.g., not rotating, the etch rate is averaged in FIG. 5E and, thus the difference between the highest and lowest etch rates in FIG. 5E is smaller than the difference between the highest and lowest etch rates in FIG. 5B. In some embodiments, when the wafer 504 is rotating, the center point 544 experiences the highest etch rate and the edge points 542 experience the lowest etch rate, although the difference between the highest and lowest etch rates is smaller than the difference between the highest and lowest etch rates in FIG. 5B. In some embodiments, when the wafer 504 is rotating, the center point 544 and the edge points 542 essentially experience the same etch rate. As shown, a non-uniform etching is produced on the film layer 502 and a top surface 508 of the etched film layer 502 has a bump shape.

In some embodiments, as shown in FIG. 5C, the etch rate is determined, e.g., measured or calculated, at two ends of a diameter of the wafer 504. Thus, the etch rate is determined at a first end 532 and a second end 534 of a diameter. In some embodiments, when the wafer 504 is not rotating, the first end 532 has the lowest etch rate because the first end 532 is farthest from the plasma beam generator 305 and the second end 534 has the highest etch rate because the second end 534 is closest to the plasma beam generator 305. Based on the determined etch rates, the first overlay offset at the first end 532 and a second overlay offset at the second end 534 are determined. In some embodiments, the first end 532 has the lowest offset, e.g., zero offset, and the second end 534 has the highest offset. In some embodiments, the highest and lowest offset, e.g., a difference between the highest and lowest offsets, and the location of the lowest and highest offsets are fed into the lithography system and the lithography system uses the fed data and incorporates the offset for each projection of the layout patterns of the photo mask into the regions 540. In some embodiments, the overlay offset is determined as a value proportional to the etch rate. In some embodiments, the overlay offset does not change along directions perpendicular to a line between the first end 532 and the second end 534 and a fitting function interpolates the overlay offsets of the first end 532 and the second end 534 over the entire wafer.

In some embodiments, the projection time of the lithography operation to pattern the resist layer is adjusted separately for each region 540 based on the overlay error associated with the region to provide a CD uniformity within a threshold value, e.g., a CDU between 1-2 percent uniformity for 3 nm CD over the entire wafer.

In some embodiments, the energy density of the plasma beam 225 at the first end 532 and the second end 534 are determined, e.g., measured. In addition, the angle 214 of the plasma beam 225 is determined and the energy density impinging on the substrate is calculated as the energy density of the plasma beam times tangent of the angle 214. In some embodiments, the etch rate is proportional to the energy density impinging on the substrate and the overlay offset is proportion to the etch rate. Thus, in some embodiments, the overlay offset difference between the first end 532 and the second end 534 is proportional to the difference between the energy density of the plasma beam 225 at the first end 532 and the second end 534.

FIG. 5G illustrates a film thickness measurement system 500 that includes a film thickness measurement device 630. The film thickness measurement device 630 includes one or more laser light sources, one or more light detectors, and a processing unit 632. The film thickness measurement system 500 further includes a stage controller 650 consistent with the stage controller 170 of FIG. 1B that is coupled to a stage 602. In addition, FIG. 5G shows that the wafer 504 with the film layer 502 is placed on the stage 602 of the film thickness measurement system 500. In some embodiments, the thickness of the film layer 502, before etching, is a uniform thickness that is a value between about 50 nm and about 60 nm. In some embodiments, the film thickness measurement device 630 generates a focusing beam 619, e.g., a laser beam, for scanning the film layer 502 and generating a reflected light beam from the film layer 502. The reflected light beam is detected by the one or more light detectors of the film thickness measurement device 630 and generates a detected signal based on the reflected light beam. In some embodiments, the detected signal is used by the processing unit 632 to generate a thickness variation signal 634 proportional to a thickness of the film layer 502. In some embodiments, the film thickness measurement device 630 commands the stage controller 650 to move the wafer 504 such that the thickness of the film layer 502 is measured at different locations of the film layer 502. Thus, in some embodiments, the thickness variation signal 634 is a thickness signal that shows the thickness of the film layer 502 at different locations of the film layer 502. In some embodiments, the film layer 502 is sampled on a regular mesh, e.g., on a rectangular mesh, and a map of the thickness of the film layer 502 may be generated. In some embodiments, after etching the uniform thickness film layer 502, the thickness of the film layer varies between 20 A to 50 A over the entire film layer 502.

As described with respect to FIGS. 5B and 5E the film layer 502 is etched by, for example, the plasma beam generator 305 of FIG. 3A and a tilted angle plasma etching is performed. Therefore, the thickness variation signal 634 is inversely proportional to the etch rate of the tilted angle plasma etching at different locations of the film layer 502, e.g., at different locations of the wafer 504.

FIGS. 6A, 6B, 6C, 6D, 6E, 6F, 6G, 6H, 6I, 6J, 6K, 6L, 6M, and 6N illustrate a cross sectional view of a semiconductor device including a magnetic random access memory (MRAM) and a sequential manufacturing process of the semiconductor device including an MRAM according to an embodiment of the present disclosure. The tilted angle plasma etching processes, the same as or similar to the foregoing embodiments described above, may be employed in the following embodiments and, thus, detailed explanation thereof may be omitted.

Figure 6B:
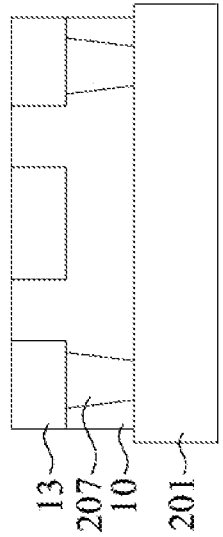
FIGS. 6A, 6B, 6C, 6D, 6E, 6F, 6G, 6H, 6I, 6J, 6K, 6L, 6M, and 6N illustrate a cross sectional view of a semiconductor device including a magnetic random access memory (MRAM) and a sequential manufacturing process of the semiconductor device including an MRAM according to an embodiment of the present disclosure-.
Figure 6C:
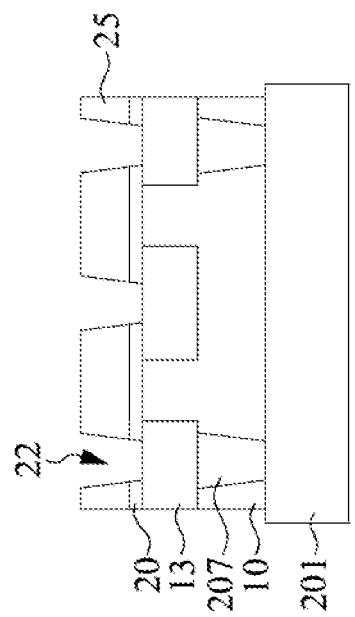
Figure 6D:
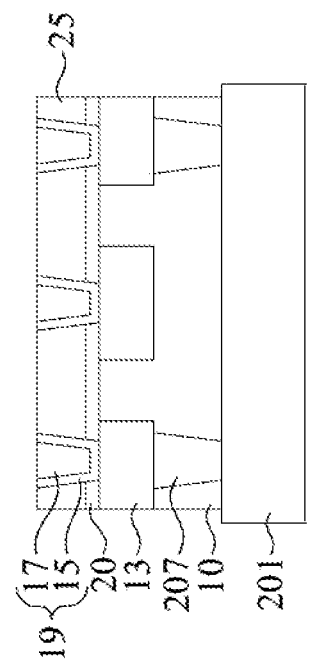
Figure 6A:
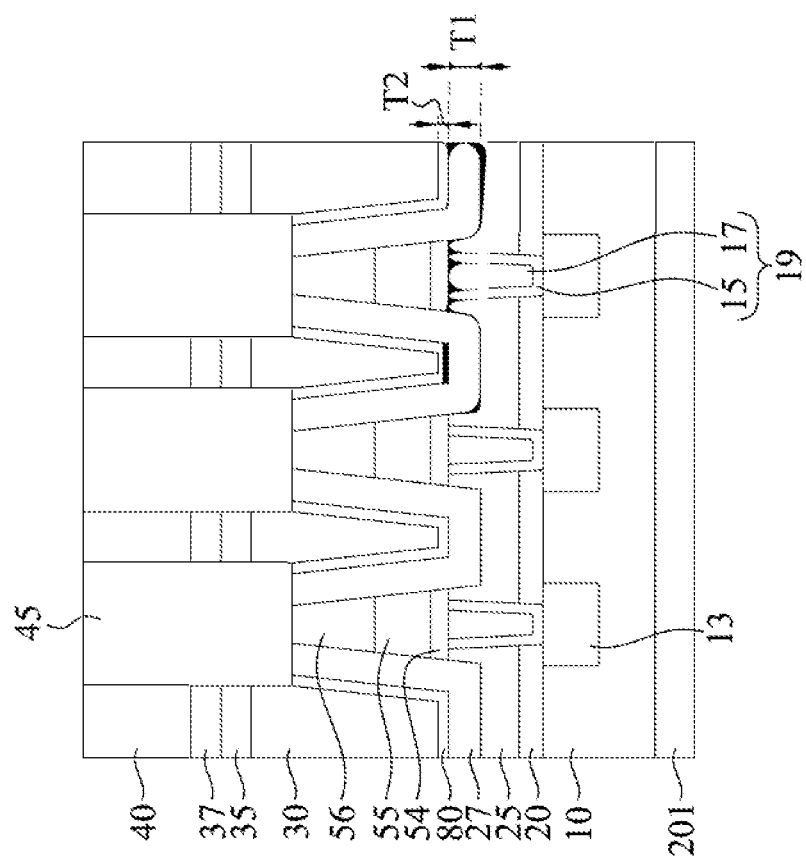

FIG. 6A shows the cross sectional view of the magnetic tunnel junction (MTJ) MRAM. As shown in FIG. 6A, the MTJ cells of an MRAM are disposed over a substrate 201. In some embodiments, the substrate 201 includes a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 201 may include an epitaxial layer (epi-layer), which may be strained for performance enhancement, and/or may include a silicon-on-insulator (SOI) structure.

Various electronic devices (not shown), such as transistors (e.g., MOS FET), are disposed on the substrate 201. The MOS FET may include a planar MOS FET, a fin FET and/or a gate-all-around FET. A first interlayer dielectric (ILD) layer 10 is disposed over the substrate 201 to cover the electronic devices. The first ILD layer 10 may be referred to as an inter-metal dielectric (IMD) layer. The first ILD layer 10 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the first ILD layer 10 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Further, a lower metal wiring 13 is formed by, for example, a damascene process. The lower metal wiring 13 includes one or more layers of conductive material, such as Cu, a Cu alloy, Al or any other suitable conductive materials. Each of the MTJ cells is disposed over the lower metal wiring 13, as shown in FIG. 6A. Although FIG. 6A shows three MTJ cells, the number of the MTJ cells is not limited to three.

As shown in FIG. 6A, a first insulating layer 20 as an etch stop layer is formed on the first ILD layer 10. In some embodiments, the first insulating layer 20 includes a material different from the first ILD layer 10 and includes silicon carbide, silicon nitride, aluminum oxide or any other suitable material. The thickness of the first insulating layer 20 is in a range from about 10 nm to about 25 nm in some embodiments.

A second ILD layer 25 is formed over the first insulating layer 20. The second ILD layer includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 10 and the material for the second ILD layer 25 are the same. In other embodiments, different dielectric materials are used for the first ILD layer 10 and the second ILD layer 25.

A via contact 19 is formed in contact with the lower metal wiring 13 and passing through the second ILD layer 25 and the first insulating layer 20 as an etch stop layer in some embodiments. In some embodiments, the via contact 19 includes a liner layer 15 and a body layer 17. The liner layer 15 includes one or more layers of Ti, TiN, Ta or TaN, or other suitable material, and the body layer 17 includes one or more layers of W, Cu, Al, Mo, Co, Pt, Ni, and/or an alloy thereof or other suitable material, in some embodiments.

An MRAM cell includes a bottom electrode 54, an MTJ film stack 55 and a top electrode 56, as shown in FIG. 6B. The MRAM cell structure has a tapered shape as shown in FIG. 6A. The width of the MRAM cell structure at the bottom (the bottom electrode 54) is greater than the width at the top (the top electrode 56). The thickness of the bottom electrode 54 is in a range from about 5 nm to about 20 nm in some embodiments. The thickness of the MTJ film stack 55 is in a range from about 15 nm to about 50 nm in some embodiments.

In some embodiments, a first insulating cover layer 27 as a sidewall spacer layer is formed on opposing side walls of the MRAM cell structure. The first insulating cover layer 27 includes one or more layers of insulating material. In some embodiments, a nitride-based insulating material is used. In certain embodiments, the nitride-based insulating material is a silicon nitride-based insulating material, such as SiON, SiON, SiCN and SiOCN. The thickness T1 of the first insulating cover layer 27 is in a range from about 5 nm to about 30 nm in some embodiments, and is in a range from about 10 nm to about 20 nm in other embodiments.

Further, a second insulating cover layer 80 is formed over the first insulating cover layer 27. The second insulating cover layer 80 includes one or more layers of insulating material different from the first insulating cover layer 27. In some embodiments, an aluminum-based insulating material is used. In certain embodiments, the aluminum-based insulating material includes aluminum oxide, aluminum nitride, aluminum oxynitride, aluminum carbide and/or aluminum oxycarbide. In some embodiments, the concentrations of Al, O, C and/or N in the thickness direction are not uniform. In certain embodiments, the concentration of Al gradually decreases from the bottom to the top of the second insulating cover layer 80, while the concentrations of O, C and/or N gradually increase from the bottom to the top of the second insulating cover layer 80. The thickness T2 of the second insulating cover layer 80 is smaller than the thickness T1 of the first insulating cover layer 27 in some embodiments. The thickness T2 is in a range from about 1 nm to about 10 nm in some embodiments, and is in a range from about 3 nm to about 5 nm in other embodiments.

Further a third ILD layer 30 is disposed in spaces between the MRAM cell structures. The third ILD layer 30 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 10, the material for the second ILD layer 25 and the material for the third ILD layer 30 are the same. In other embodiments, at least two of the ILD layers are made of different dielectric materials.

Further, a fourth ILD layer is disposed over the third ILD layer 30. In some embodiments, the fourth ILD layer is a multiple layer structure and includes a first dielectric layer 35 as an etch stop layer formed on the third ILD layer 30, a second dielectric layer 37 formed on the first dielectric layer 35 and a third dielectric layer 40 formed on the second dielectric layer. In other embodiments, the fourth ILD layer is a two-layer structure without one of the first or second dielectric layers.

In some embodiments, the first dielectric layer 35 and second dielectric layer 37 are made of different materials than the third dielectric layer 40 and include one or more layers of SiN ($Si_3N_4$), SiON, SiOCN, SiCN, SiC or any other suitable material. In some embodiments, the first dielectric layer 35 and second dielectric layer 37 are made of different materials from each other.

The third dielectric layer 40 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like.

In some embodiments, the material for the first ILD layer 10, the material for the second ILD layer 25, the material for the third ILD layer 30 and the material for the third dielectric layer 40 are the same. In other embodiments, at least two of the layers are made of different dielectric materials. The thickness of the third dielectric layer 40 is greater than the thicknesses of the first and second dielectric layers 35 and 37 in some embodiments.

A conductive contact 45 is formed in contact with the top electrode 56, as shown in FIG. 6A. The conductive contact 45 is the same as or similar to the lower metal wiring 13 and/or the via contact 19 and is made of, for example, Cu, Al, Ta, Ti, Mo, Co, Pt, Ni, W, TiN and/or TaN and/or an alloy thereof or other suitable material.

As shown in FIG. 6A, the upper surface of the top electrode 56 is substantially flush with the upper surfaces of the first insulating cover layer 27 and/or the second insulating cover layer 80 in some embodiments. In some embodiments, tilted angle plasma etching is performed to produce components, e.g., the top electrode 56 or the MTJ film stack 55, of the MRAM cells.

It is understood that additional operations can be provided before, during, and after processes shown by FIGS. 6B, 6C, 6D, 6E, 6F, 6G, 6H, 6I, 6J, 6K, 6L, 6M, and 6N and some of the operations described below can be replaced or eliminated, for additional embodiments of the method. Material, configuration, dimensions and/or processes the same as or similar to the foregoing embodiment described with respect to FIG. 6A may be employed in the following embodiments, and detailed explanation thereof may be omitted.

As shown in FIG. 6B, lower metal wirings 13 are formed in the first ILD layer 10 over the substrate 201. In some embodiments, via contacts 207 are provided under the lower metal wirings 13. Then, as shown in FIG. 6C, a first insulating layer 20 as an etch stop layer is formed over the structure of FIG. 6B, and a second ILD layer 25 is formed over the first insulating layer 20. Further, as shown in FIG. 6C, via contact openings 22 are formed to expose the upper surface of the lower metal wirings 13, by using one or more lithography and etching operations. Subsequently, via contact 19 including the liner layer 15 and the body layer 17 are formed, as shown in FIG. 6D. One or more film forming operations, such as CVD, PVD including sputtering, ALD, electro-chemical plating and/or electro-plating, are performed, and a planarization operation, such as CMP, is performed to fabricate the via contacts 19.

Figure 6F:
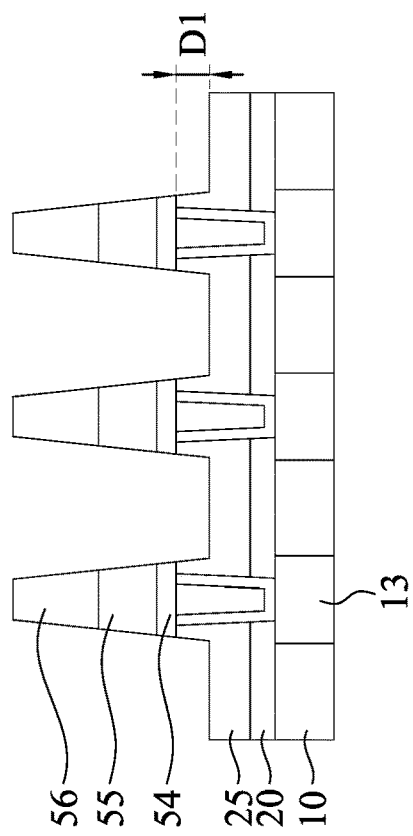
Figure 6E:
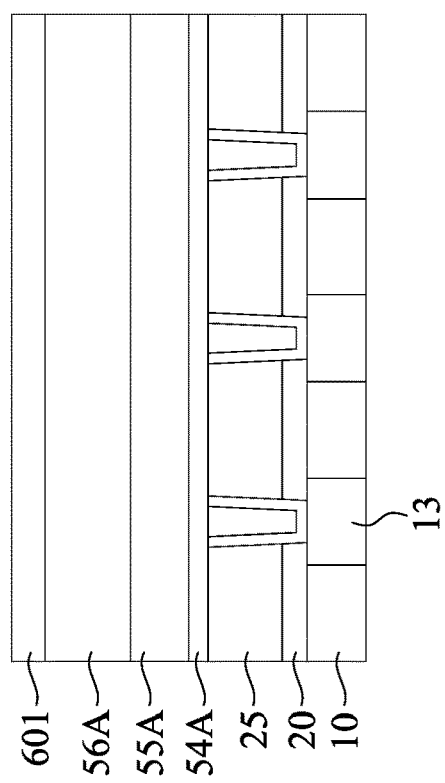

Then, as shown in FIG. 6E, a first conductive layer 54A for the bottom electrode 54, a stacked layer 55A for the MTJ film stack 55 and a second conductive layer 56A for the top electrode 56 are sequentially formed. In some embodiments, a layer 601 for a hard mask is further formed on the second conductive layer 56A.

By using one or more lithography and etching operations, the film stack shown in FIG. 6E is patterned into an MRAM cell structure including the bottom electrode 54, the MTJ film stack 55 and the top electrode 56, as shown in FIG. 6F. In some embodiments, after the patterning the second conductive layer 56A, the stacked layer 55A and the first conductive layer 54A, the second ILD layer 25 is partially recessed. The amount D1 of the recess is in a range from about 1 nm to about 30 nm in some embodiments.

Figure 6H:
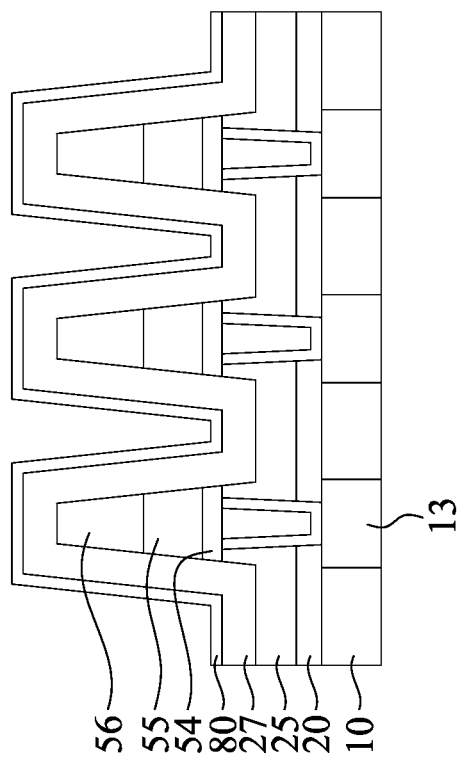
Figure 6G:
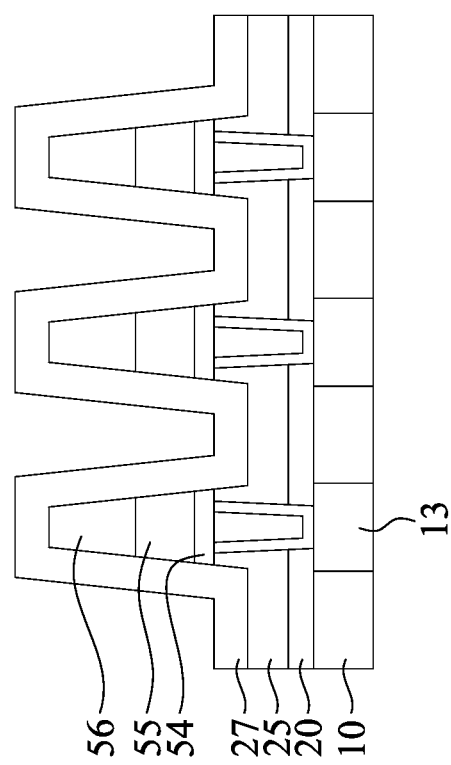

Subsequently, as shown in FIG. 6G, a first insulating cover layer 27 is formed to cover the MRAM cell structure. The first insulating cover layer 27 can be formed by CVD, PVD or ALD or any other suitable film deposition method. In some embodiments, the first insulating cover layer 27 is formed by CVD, PVD or ALD at a lower temperature range less than about 150° C., such as a range from about 100° C. to about 150° C. When the first insulating cover layer 27 is formed at a higher temperature, such as a range from about 200° C. to about 300° C. (or more), the film formation process may cause damage to the MTJ film stack 55 since the first insulating cover layer is directly formed on the MTJ film stack 55. As shown in FIG. 6G, the first insulating cover layer 27 is conformally formed.

Then, as shown in FIG. 6H, a second insulating cover layer 80 is formed to cover the MRAM cell structure. The second insulating cover layer 80 can be formed by CVD, PVD or ALD or any other suitable film deposition method. As shown in FIG. 6H, the second insulating cover layer 80 is conformally formed. As set forth above, the second insulating cover layer 80 includes an aluminum-based insulating material in some embodiments. The aluminum-based insulating material, such as AlO ($Al_2O_3$), AlN, AlC, AlOC and AlON, can be formed by the following operations. First, an aluminum layer is formed on the first insulating cover layer 27. The aluminum layer is formed by, for example, metal-organic CVD (MOCVD) or ALD using tri-methyl-aluminum (TMA). Then, a plasma treatment using $NH_3$, $CO_2$ and/or CO gases is performed over the aluminum layer, to convert the aluminum layer into AlO, AlN, AlC, AlOC or AlON. The concentrations of Al, O, C and/or N in the plasma treated aluminum layer are not uniform, in particular, along the vertical direction. The AlON layer may be made of two layers of AlO and AlN. In some embodiments, a thin layer of aluminum having a thickness of less than about 1 nm remains at the bottom of the layer. A chemical oxidation of the aluminum layer using an oxidation solution may be employed. In some embodiments, the AlO, AlOC, AlC, AlN and/or AlON layer can be directly formed by CVD, PVD or ALD or other suitable method by using appropriate source gases. In some embodiments, the second insulating cover layer 80 is formed by CVD, PVD or ALD at a temperature range in a range from about 300° C. to about 450° C. Although lower forming temperature (e.g., less than 300° C.) may be employed, since there is the first insulating cover layer 27 is formed to cover the MTJ film stack 55, a higher forming temperature (about 300° C. to about 450° C.) may not damage the MTJ film stack 55.

Figure 6J:
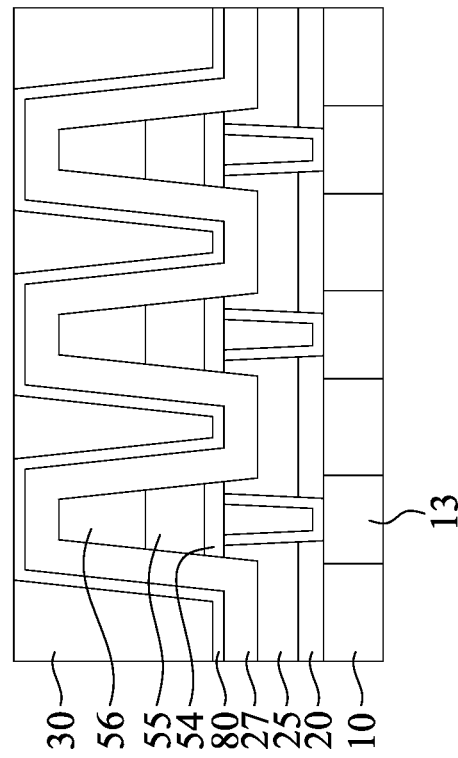
Figure 6I:
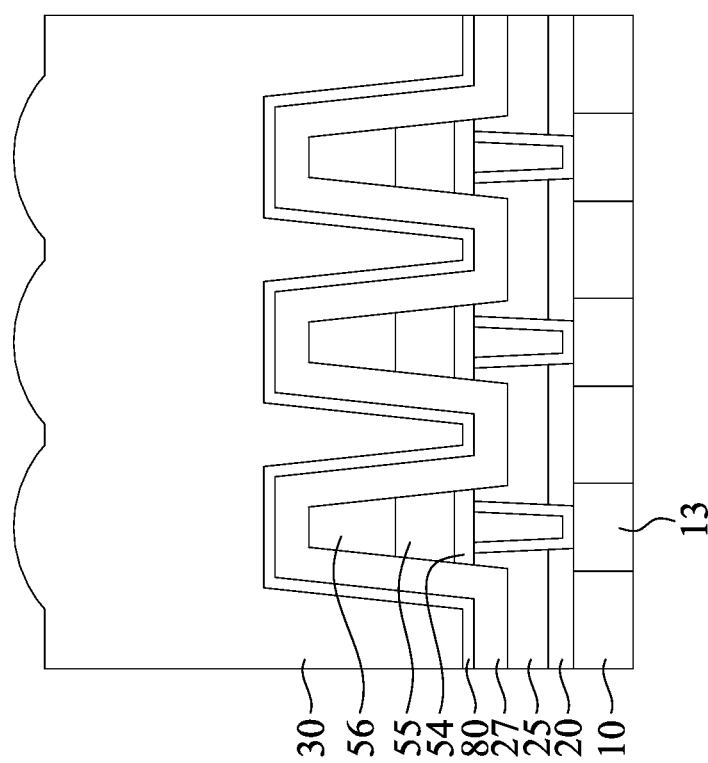

Next, as shown in FIG. 6I, the third ILD layer 30 is formed to fully cover the second insulating cover layer 80. In some embodiments, an etch-back operation is performed on the third ILD layer 30, and then a CMP operation is performed, as shown in FIG. 6J. Because the selectivity for the CMP operation between the second insulating cover layer 80 and the third ILD layer 30 is high, the CMP operation can utilize the second insulating cover layer 80 as a stop layer. When the CMP operation stops at the upper surface of the second insulating cover layer 80, it is possible to prevent over-etching of the third ILD layer 30, and thus the upper surface of the second insulating cover layer 80 above the MRAM cell structure is substantially flush with the upper surfaces of the third ILD layer 30 in some embodiments.

Figure 6L:
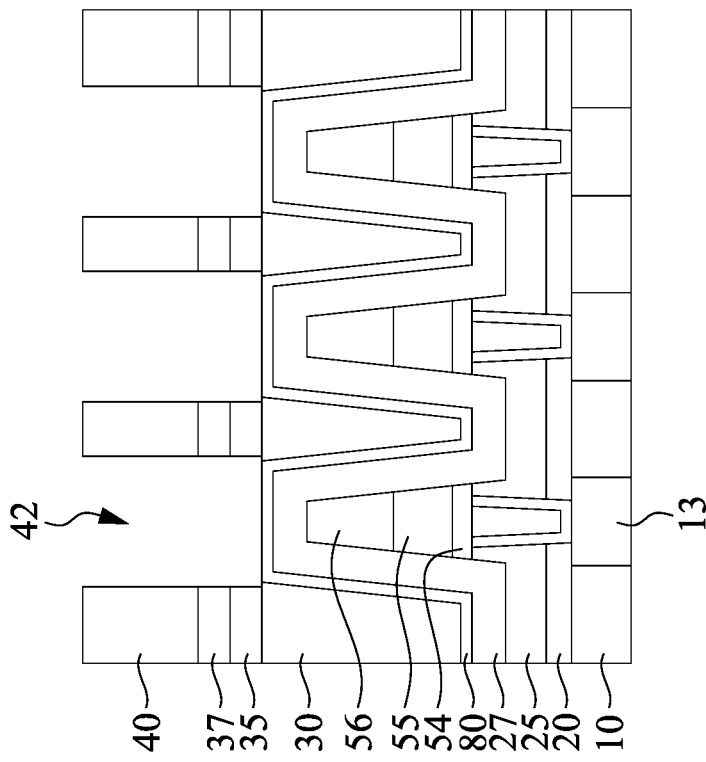
Figure 6K:
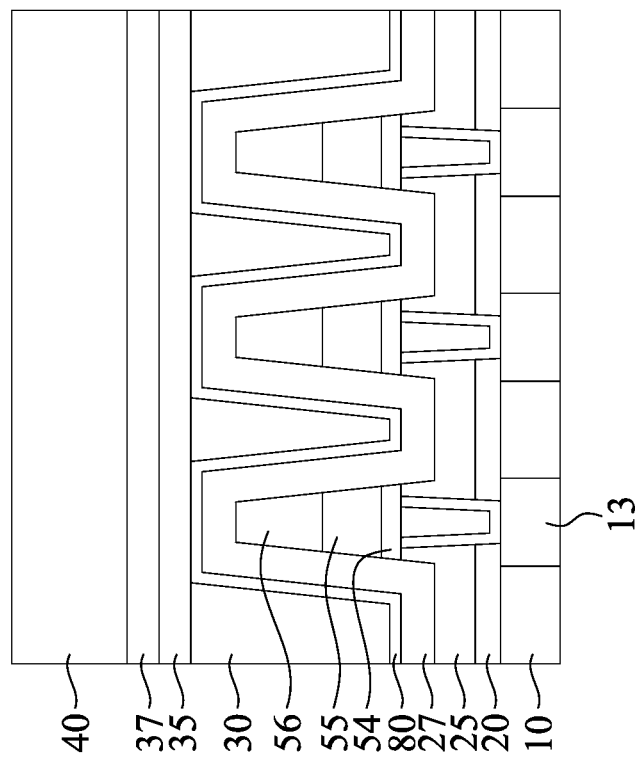

Subsequently, as shown in FIG. 6K, a fourth ILD layer including a first dielectric layer 35, a second dielectric layer 37 and a third dielectric layer 40 is formed over the structure of FIG. 6J. The dielectric layers of the fourth ILD layer can be formed by CVD, PVD or ALD or other suitable film formation method. In some embodiments, the third dielectric layer 40 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Then, as shown in FIG. 6L, contact openings 42 are formed by using one or more lithography and etching operations. Because the selectivity in the etching operation between the second insulating cover layer 80 and the fourth ILD layer is high, the etching operation can utilize the second insulating cover layer 80 as an etch stop layer.

Figure 6N:
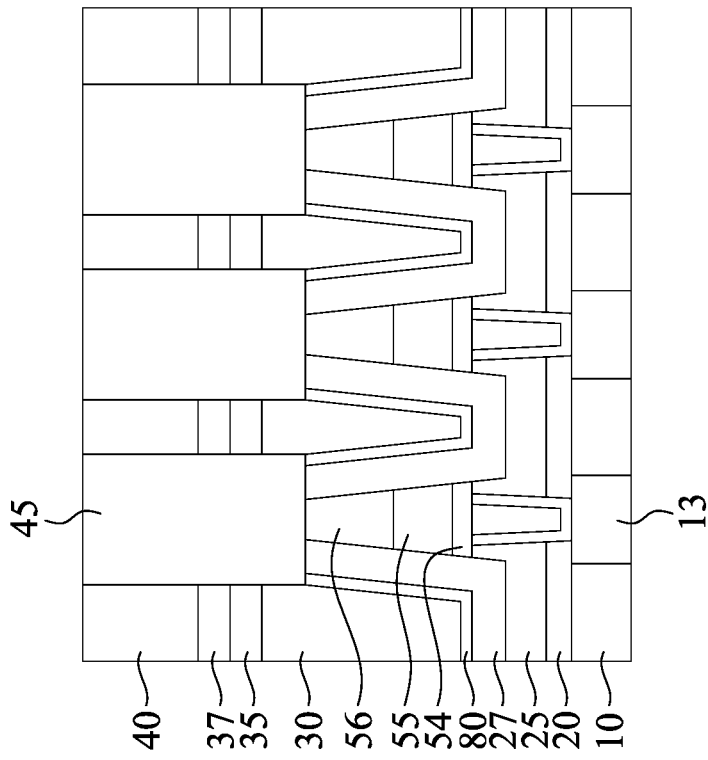
Figure 6M:
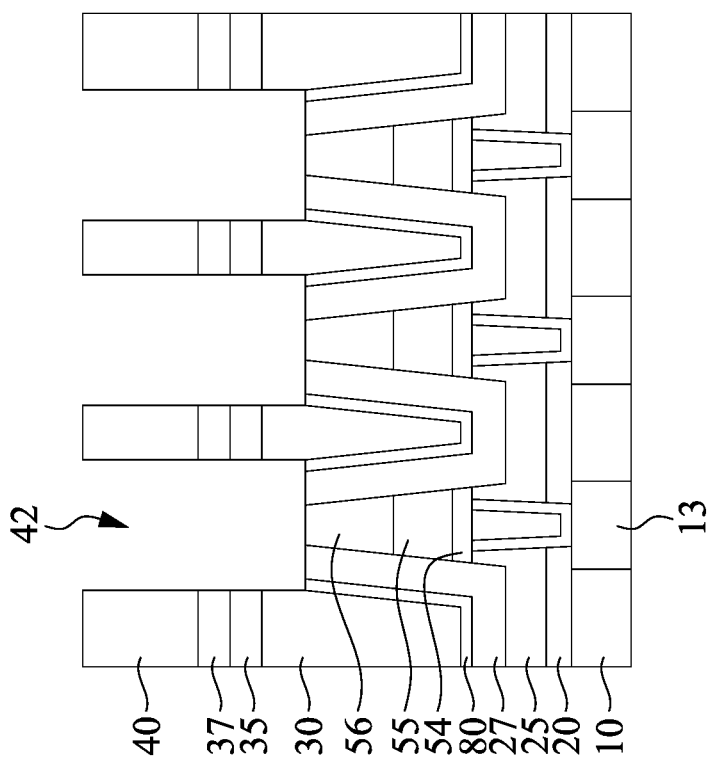

Next, as shown in FIGS. 6M and 6N, a part of the second insulating cover layer 80 and a part of the first insulating cover layer 27 are removed by dry and/or wet etching, thereby exposing the top electrode 56. In some embodiments, part of the second insulating cover layer 80 is removed, and then part of the first insulating cover layer 27 is removed. In some embodiments, one or more wet etching operation is used. In certain embodiments, a wet etching operation is performed to remove the second insulating cover layer 80 and a dry etching operation is performed to remove first insulating cover layer 27. As set forth above, the second insulating cover layer 80 is made at a higher temperature than the first insulating cover layer 27, and thus the second insulating cover layer 80 is a "hard" layer in a dry etching operation. Accordingly, it is advantageous to use a wet etching to remove the second insulating cover layer 80. In contrast, the first insulating cover layer is made at a low temperature and thus is a "soft" layer in a dry etching operation. Thus, a dry etching operation can be utilized to remove the first insulating cover layer 27 with suppressing damage on the top electrode 56. In other embodiments, a wet etching operation is also performed to remove the first insulating cover layer 27. By using wet etching, it is possible to suppress damage to the MTJ film stack 55. In some embodiments, the dry etching is performed by tilted angle plasma etching described above.

Subsequently, as shown in FIG. 6N, the contact openings 42 are filled with a conductive material so as to form conductive contacts 45 contacting the exposed top electrode 56. In some embodiments, during the etching of the first and/or second insulating cover layers, the third ILD layer 30 and/or the first dielectric layer 35 is/are also slightly laterally etched. When the third ILD layer 30 is laterally etched, the bottom portion of the conductive contact 45 has a broader width than the upper portion. In some embodiments, the amount of the lateral etching of the third ILD layer 30 is in a range from about 1 nm to about 2 nm. When the first dielectric layer 35 is laterally etched, the conductive contact 45 has a protrusion on its side faces. In some embodiments, the amount of the lateral etching of the first dielectric layer 35 is in a range from about 1 nm to about 2 nm. In some embodiments, the lateral etching is performed by tilted angle plasma etching described above. It is understood that the device shown in FIG. 6N undergoes further semiconductor processes to form various features such as interconnect metal layers, dielectric layers, passivation layers, etc.

Figure 7:
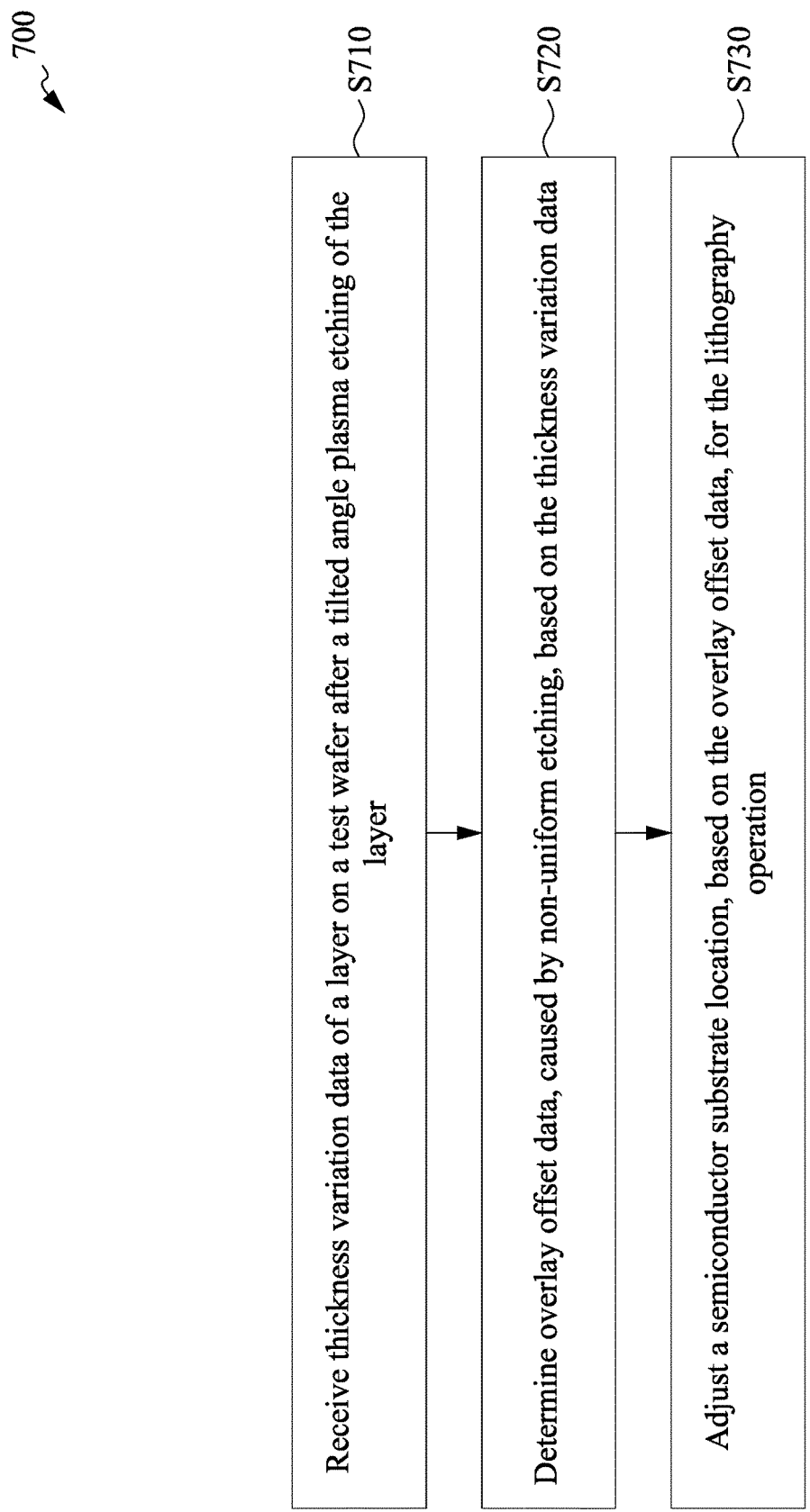
FIG. 7 illustrates a flow diagram of a process for reducing an overlay offset between circuit patterns of an upper layer and corresponding circuit patterns of a lower layer after the upper layer is etched in accordance with some embodiments of the disclosure.

FIG. 7 illustrates a flow diagram of a process 700 for compensating overlay offsets during lithography operation of integrated circuit manufacturing processes in accordance with some embodiments of the disclosure. The process 700 or a portion of the process 700 may be performed by the system of FIG. 1B. In some embodiments, the process 700 or a portion of the process 700 is performed and/or is controlled by the computer system 900 described below with respect to FIGS. 9A and 9B. In some embodiments, the process 700 or a portion of the process 700 is performed by the control system 800 of FIG. 8 described below.

The method includes an operation S710, where thickness variation data of a layer on a test wafer is received after the layer undergoes a tilted angle plasma etching, as explained with respect to FIGS. 5A-5E. As shown and described with respect to FIG. 5G, the thickness variation signal 634 of a layer 502 that includes the thickness variation data is received by the film thickness measurement device 630. As will be described below with respect to FIG. 8, the thickness variation signal 634 (or data) is sent via the main controller 840 to the analyzer module 830.

In operation S720, overlay offset data, which will be caused by the non-uniform etching of a production wafer, is determined based on the thickness variation data. As will be described below with respect to FIG. 8, the analyzer module 830 initially determines an etch rate of the tilted angle plasma etching based on the thickness variation signal 634. In some embodiments, the etch rate of the tilted angle plasma etching per location on the wafer is inversely proportional to the thickness variation data that is included in the thickness variation signal 634. Additionally, the analyzer module 830 may determine the overlay offset data based on the etch rate per location on the wafer.

In operation S730, in a lithography operation, the semiconductor substrate location is adjusted based on the overlay offset data, which may vary depending on locations of the wafer. As noted above, the analyzer module 830 may determine the overlay offset data per location on the wafer. When the circuit pattern on the reticle is imaged, e.g., projected, on the wafer in the lithography operation, the projected image covers a predetermined portion of the wafer and, thus, the overlay offset may be approximated as constant values in the X-direction and Y-direction inside the predetermined portion of the wafer. The X-direction and Y-direction constant values determined from the overlay offset data are transferred to the stage controller 170 of FIG. 1B. In some embodiments, the stage controller 170 moves the stage 160 by a portion of the overlay offset values in the X-direction and Y-direction prior to the lithography operation to compensate for the overlay offset that will be created in a subsequent step by the tilted angle plasma etching. In some embodiments, the stage controller 170 moves the stage 160 between 50 percent to 120 percent, e.g., 80 percent, of the overlay offset values in the X-direction and Y-direction. In some embodiments, the stage controller 170 moves the stage 160 in opposite direction of the offsets to compensate the offsets, depending on +/− values of the offset data. In some embodiments, the overlay offset values varies for each projection of the photo mask layout patterns on the wafer and, thus, for each projection of the photo mask on the wafer, stage controller 170 moves the stage 160 by a different value to compensate for the overlay offset that will be created in a subsequent step.

Figure 8:
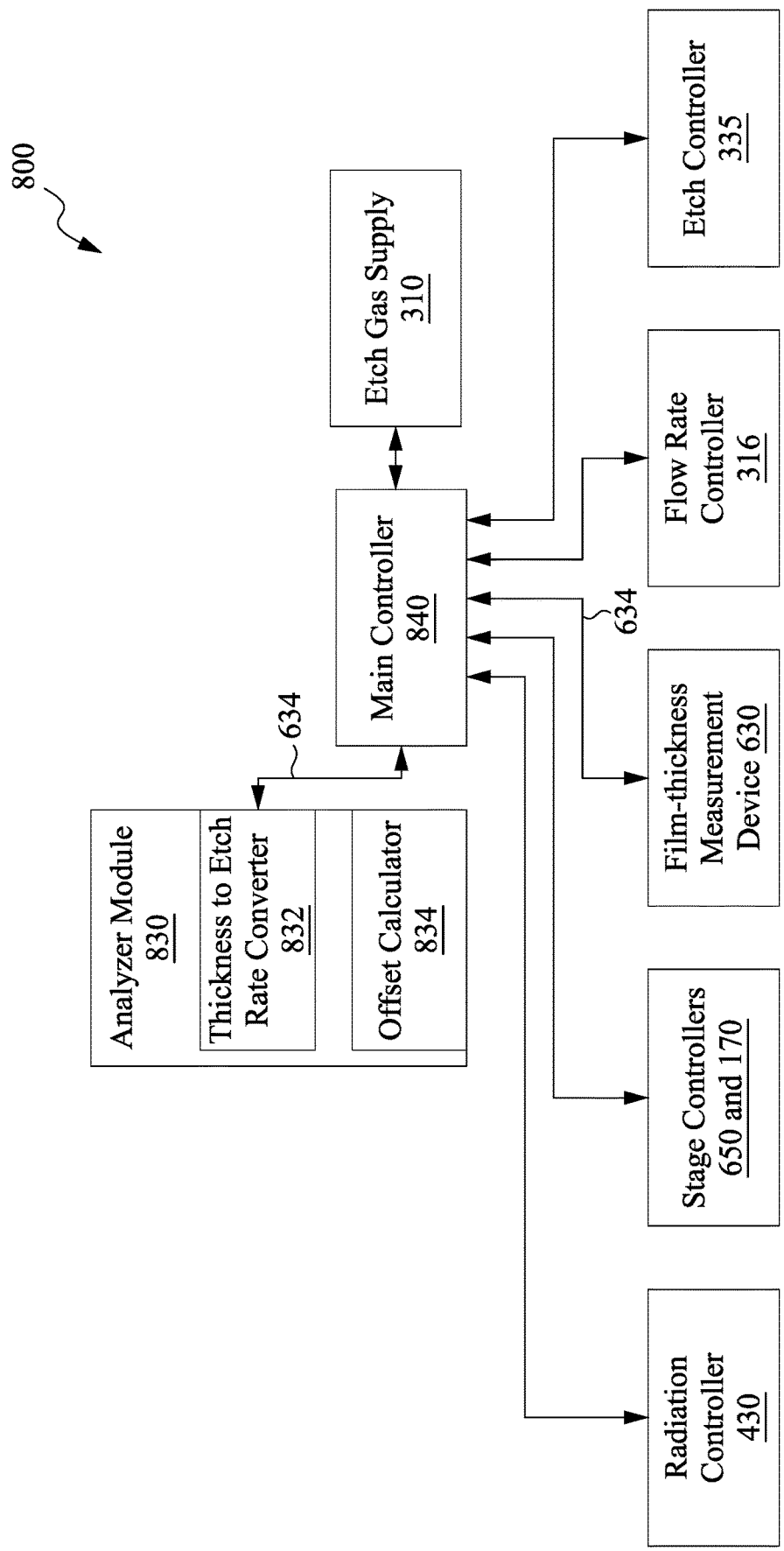
FIG. 8 shows a control system for reducing an overlay offset between circuit patterns of an upper layer and corresponding circuit patterns of a lower layer after the upper layer is etched in accordance with some embodiments of the present disclosure.

FIG. 8 shows a control system 800 for compensating overlay offsets during lithography of integrated circuits in accordance with some embodiments of the present disclosure. The control system 800 includes an analyzer module 830 and a main controller 840 coupled to each other. In some embodiments, the control system 800 includes the etch controller 335, the radiation controller 430, the film thickness measurement device 630, the stage controllers 170 and 650, and the flow rate controller 316 that controls the flow rate in combination with the adjustable valve 314 of FIG. 3A. In some embodiments, the etch controller 335 or the analyzer module 830 directly controls the flow rate controller 316 and the etch gas supply 310. In some embodiments, the etch controller 335 or the analyzer module 830 controls the flow rate controller 316 and the etch gas supply 310 through the main controller 840. In addition the analyzer module 830 includes a thickness to etch rate converter 832 and an offset calculator 834. In some embodiments, the thickness variation signal 634 is sent from the film thickness measurement device 630 via the main controller 840 to the analyzer module 830. In some embodiments, the etch rate of the tilted angle plasma etching per location on the wafer is determined by the thickness to etch rate converter 832 such that the etch rate is inversely proportional to the thickness variation data that is included in the thickness variation signal 634. Additionally, the offset calculator 834 of the analyzer module 830 determines the overlay offset data based on the determined etch rate per location on the wafer. In some embodiments, the overlay offset data is proportional to the etch rate such that a higher etch rate produces a higher overlay offset and a lower etch rate produces no overlay offset or a lower overlay offset. In some embodiments, the analyzer module is included in the main controller 840. In some embodiments, the main controller 840 or the analyzer module 830 via the main controller 840 commands the film thickness measurement device 630 to perform a film thickness measurement of a thin film, e.g., an oxide layer or a semiconductor layer, on a test wafer. In some embodiments, the analyzer module 830 performs the operation of setting the flow rate controller 316 to generate one or more first flow rates of an etching gas of the plasma beam generator 305 to generate one or more corresponding plasma beams.

As described, in each projection of the layout patterns of the photo mask, a predetermined portion of the substrate (wafer) is imaged and, thus, during the lithography operation the photo mask is imaged onto different non-overlapping regions 540 of FIG. 5F of the substrate. In some embodiments, the offset calculator 834 divides the substrate into the different non-overlapping regions 540 and calculates the offset data inside each one of the non-overlapping regions 540 based on the remaining thickness of the etched film layer 502 of FIG. 5B or 5E. In some embodiments, for each region 540, the offset calculator 834 uses the thickness variation signal 634 and calculates the overlay offset data of the points inside each region 540. In some embodiments, the offset calculator 834 determines, calculates, an average value and/or a median value of the overlay offset data of the points inside each region 540 and assigns to the region 540. In some embodiments, offset calculator 834 determines a running average and/or median of the overlay offset data for a plurality of overlapping regions that cover the entire substrate and generates a map of the running average or median for the entire substrate.

In some embodiments, before compensating the overlay offsets during lithography as described above, the overlay offset, e.g., the overlay offset error (the 3-sigma error) after tilted angle plasma etching in the X-direction is 4.8 nm and after the compensation becomes 3.9 nm. In addition, the overlay offset, e.g., the overlay offset error (the 3-sigma error) after tilted angle plasma etching in the Y-direction is 4.0 nm and after the compensation becomes 3.9 nm.

In some embodiments, in addition to measuring the remaining thickness on the test wafer to determine the overlay offset, another wafer goes through the processes and the overlay offset is determined based on the processed wafer. In some embodiments, the overlay offsets determined from a processed wafer and the overlay offset determined from the thickness measurement of the test wafer are used together, e.g., combined using a weighted combination, to determine the overlay offset errors.

Figure 9A:
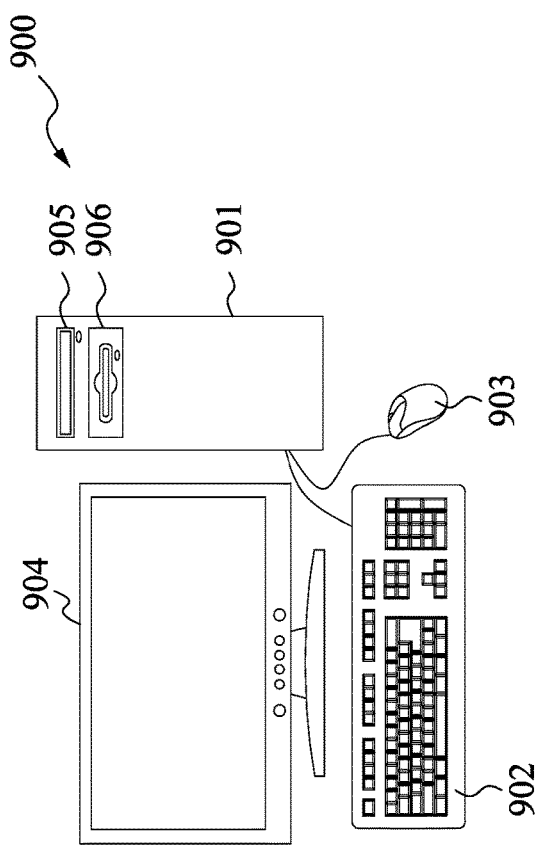
FIGS. 9A and 9B illustrate an apparatus for reducing an overlay offset between circuit patterns of an upper layer and corresponding circuit patterns of a lower layer after the upper layer is etched in accordance with some embodiments of the present disclosure.
Figure 9B:
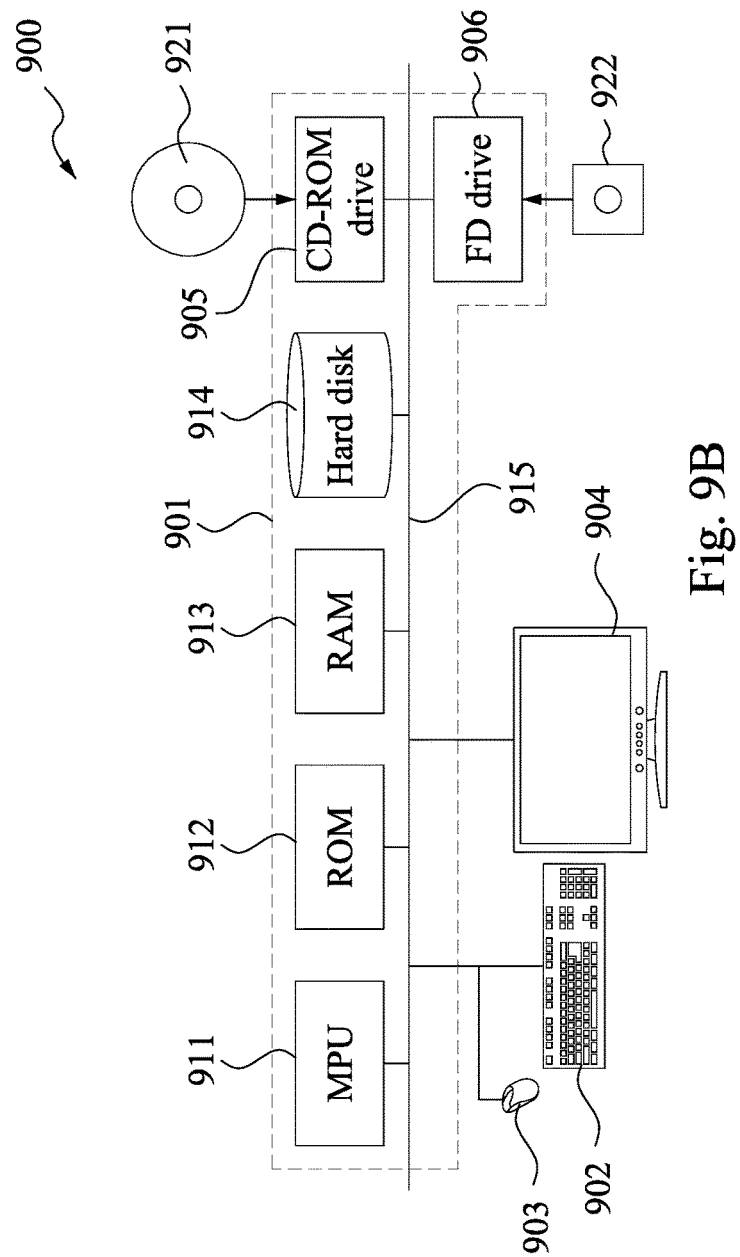

FIGS. 9A and 9B illustrate an apparatus for compensating overlay offsets during lithography of integrated circuits in accordance with some embodiments of the present disclosure. In some embodiments, the computer system 900 is used for performing the functions of the modules of FIG. 8 that include the main controller 840, the analyzer module 830, the etch controller 335, the radiation controller 430, the stage controllers 170 and 650, and the flow rate controller 316. In some embodiments, the computer system 900 is used to execute the process 700 of FIG. 7.

FIG. 9A is a schematic view of a computer system that performs the functions of an apparatus compensating overlay offsets during lithography of integrated circuits. All of or a part of the processes, method and/or operations of the foregoing embodiments can be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors, such as a micro processing unit (MPU) 911, a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions for compensating overlay offsets during lithography of integrated circuits in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network. The program does not necessarily have to include, for example, an operating system (OS) or a third party program to cause the computer 901 to execute the functions of the control system for compensating overlay offsets during lithography of integrated circuits in the foregoing embodiments. The program may only include a command portion to call an appropriate function (module) in a controlled mode and obtain desired results.

According to some embodiments of the present disclosure, a method of patterning an integrated circuit to compensate overlay offsets includes receiving test layer thickness variation data when a test layer with a known thickness disposed over a semiconductor test substrate undergoes tilted angle plasma etching. The method includes determining overlay offset data per semiconductor substrate locations caused by the tilted angle plasma etching. The overlay offset data is determined based on the received thickness variation data and the overlay offset data is associated with an overlay between first circuit patterns of a first layer on a semiconductor substrate and corresponding second circuit patterns of a second layer disposed over the first layer on the semiconductor substrate. The method also includes adjusting a location of the semiconductor substrate based on the overlay offset data during a lithography operation to pattern a resist layer over the second layer by projecting layout patterns of a reticle corresponding to the second circuit patterns onto the resist layer. The method further includes patterning the second layer based on the projected layout patterns of the reticle on the resist layer and using the tilted angle plasma etching. In an embodiment, the overlay offset data is determined based on an etch rate of the test layer when etched by the tilted angle plasma etching.

In an embodiment, the method further includes determining overlay offsets at a first point with highest etch rate and at a second point with lowest etch rate of a wafer, and fitting an interpolation function between the first point and the second point. In an embodiment, the tilted angle plasma etching induces non-uniform etching of the second layer, and the overlay offset data depends on the semiconductor substrate locations. In an embodiment, the adjusting the location of the semiconductor substrate by the overlay offset data to bring a 3-sigma overlay offset error less than or equal to 4 nm. In an embodiment, the method further includes separately adjusting a projection time of the lithography operation to pattern the resist layer over the second layer for each projection of layout patterns of a photo mask to provide a critical dimension (CD) uniformity between 1-2 percent for a 3 nm CD over an entire wafer. In an embodiment, the adjusting the location of the semiconductor substrate based on the overlay offset data further comprises adjusting the location of the semiconductor substrate based on an average value of at least four values of the overlay offset data corresponding to four points within a region of the semiconductor substrate where, in each projection, the layout patterns of the reticle corresponding to the second circuit patterns are projected onto the resist layer.

According to some embodiments of the present disclosure, a method of patterning an integrated circuit to compensate overlay offsets includes disposing a test layer with known thickness on an entire surface area of a test substrate and etching the test layer of the test substrate with a plasma etching with a tilted angle. The method includes determining test layer thickness variations of the test layer per semiconductor substrate locations after the tilted angle plasma etching. The method also includes determining overlay offset data per semiconductor substrate locations caused by the tilted angle plasma etching. The overlay offset data is determined based on the determined test layer thickness variations and the overlay offset data is associated with an overlay between first circuit patterns of a first layer on a semiconductor substrate and corresponding second circuit patterns of a second layer disposed over the first layer on the semiconductor substrate. The method further includes adjusting a location of the semiconductor substrate based on the overlay offset data during a lithography operation to pattern a resist layer over the second layer by projecting layout patterns of a reticle corresponding to the second circuit patterns onto the resist layer. The locations of the semiconductor substrate are adjusted based on a value of the overlay offset data within a region of the semiconductor substrate where the layout patterns of the reticle corresponding to the second circuit patterns are projected onto the resist layer. The method includes patterning the second layer based on the projected layout patterns of the reticle on the resist layer and using the tilted angle plasma etching. In an embodiment, the tilted angle plasma etching generates non-uniform etching of the test layer on the test substrate. In an embodiment, the test layer is a thin film and the test layer thickness variations is measured by a thin film thickness measurement operation. In an embodiment, the tilted angle plasma etching is ion beam etching. In an embodiment, the method further includes etching the test layer of the test substrate with tilted angle plasma etching while the test substrate is rotating with a uniform speed, and patterning the second layer based on the projected layout patterns of the reticle on the resist layer and using the tilted angle plasma etching while the semiconductor substrate is rotating the uniform speed. In an embodiment, the adjusting the location of the semiconductor substrate based on a value of the overlay offset data further comprises adjusting the location of the semiconductor substrate based on a median value of the overlay offset data within a region of the semiconductor substrate where, in each projection, the layout patterns of the reticle corresponding to the second circuit patterns are projected onto the resist layer. In an embodiment, the plasma etching is either tilting a surface of the semiconductor substrate with respect to an ion beam of the plasma etching, or impinging, with a tilted angle, the ion beam of the plasma etching onto the semiconductor substrate.

According to some embodiments of the present disclosure, a system for compensating overlay offsets during lithography of integrated circuits includes a main controller and an analyzer module coupled to the main controller. The system includes a plasma etching device that comprises a plasma beam generator configured to generate a plasma beam, an etching chamber, a stage that holds a substrate in the etching chamber, a flow rate controller coupled to the plasma beam generator, and an etch control circuit coupled to the plasma beam generator to induce a tilted angle to the plasma beam. The system further includes an exposure device that comprises a reflective reticle, a stage coupled to a stage controller such that the stage controller is coupled to the main controller, a substrate with a photo resist layer disposed on the substrate, a radiation source to generate a radiation beam, an illumination optical system that includes one or more first optical components to project the radiation beam on the reflected reticle and a projection optical system that includes one or more second optical components to project a reflected radiation beam from the reflective reticle onto the photo resist layer of the substrate. The analyzer module to receive overlay offset data per semiconductor substrate locations caused by the tilted angle plasma etching. The overlay offset data is determined based on the received thickness variation data when a uniform thickness semiconductor layer undergoes the tilted angle plasma etching for a predetermined amount of time, and the overlay offset data is associated with an overlay between first circuit patterns of a first layer on a semiconductor substrate and corresponding second circuit patterns of a second layer disposed over the first layer on the semiconductor substrate. In an embodiment, the etch control circuit applies an electric filed or a magnetic field to the plasma beam to induce the tilted angle to the plasma beam. In an embodiment, the system further includes a film thickness measurement device. The plasma etching device performs the tilted angle plasma etching on the uniform thickness semiconductor layer disposed on a test wafer for the predetermined amount of time, wherein the film thickness measurement device is configured to measure thickness values of a remaining semiconductor layer on the test wafer and send the measured thickness values to the analyzer module, and wherein the analyzer module is configured to determine the overlay offset data per semiconductor substrate locations based on the measured thickness values. In an embodiment, the main controller receives the overlay offset data per semiconductor substrate locations from the analyzer module, sends the overlay offset data per semiconductor substrate locations to the stage controller of the exposure device, and commands the stage controller of the exposure device to move the stage by overlay offset data before turning on the radiation source to project layout patterns of the reflective reticle on the photo resist layer of the substrate. In an embodiment, the exposure device further includes a radiation controller coupled to the radiation source. The main controller commands the radiation controller to adjust an amount of time the radiation source is turned on to adjust a projection energy for imaging the layout patterns of the reflective reticle on the photo resist layer of the substrate. In an embodiment, the flow rate controller of the plasma etching device is coupled to the main controller and the main controller commands the flow rate controller to adjust an intensity of the plasma beam.

In some embodiments, overlay offsets that are caused by etching operation may be compensated in the lithography operation of integrated circuits that is performed before the etching operation. The overlay offset may be calculated by determining the non-uniformity of the etching process and calculated offsets may be implemented by mask offsets during the lithography operation. The non-uniformity of the etching process is determined by etching a layer having a known thickness and measuring the remaining thickness of the etched layer. Thus, determining the overlay offset errors, described above, is a fast process and determines the overlay offset errors for the entire substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of patterning an integrated circuit for semiconductor device manufacturing, comprising:
   receiving thickness variation data of a test layer when the test layer with a known thickness disposed over a semiconductor test substrate undergoes tilted angle plasma etching;
   determining overlay offset data per semiconductor substrate locations caused by the tilted angle plasma etching, wherein the overlay offset data is determined based on the received thickness variation data, wherein the overlay offset data is associated with an overlay between first circuit patterns of a first layer on a semiconductor substrate and corresponding second circuit patterns of a second layer disposed over the first layer on the semiconductor substrate;
   adjusting a location of the semiconductor substrate based on the overlay offset data during a lithography operation to pattern a resist layer over the second layer by projecting layout patterns of a reticle corresponding to the second circuit patterns onto the resist layer; and
   patterning the second layer based on the projected layout patterns of the reticle on the resist layer and using the tilted angle plasma etching.

2. The method of claim 1, wherein the overlay offset data is determined based on an etch rate of the test layer when etched by the tilted angle plasma etching.

3. The method of claim 1, further comprising:
   determining overlay offsets at a first point with highest etch rate and at a second point with lowest etch rate of a wafer; and
   fitting an interpolation function between the first point and the second point.

4. The method of claim 1, wherein the tilted angle plasma etching induces non-uniform etching of the second layer, and wherein the overlay offset data depends on the semiconductor substrate locations.

5. The method of claim 1, wherein the adjusting the location of the semiconductor substrate by the overlay offset data to bring a 3-sigma overlay offset error less than or equal to 4 nm.

6. The method of claim 1, the lithography operation further comprises:
   separately adjusting a projection time of the lithography operation to pattern the resist layer over the second layer for each projection of layout patterns of a photo mask to provide a critical dimension (CD) uniformity between 1-2 percent for a 3 nm CD over an entire wafer.

7. The method of claim 1, wherein the adjusting the location of the semiconductor substrate based on the overlay offset data further comprises:
   adjusting the location of the semiconductor substrate based on an average value of at least four values of the overlay offset data corresponding to four points within a region of the semiconductor substrate where, in each projection, the layout patterns of the reticle corresponding to the second circuit patterns are projected onto the resist layer.

8. A method of patterning an integrated circuit for semiconductor device manufacturing, comprising:
   disposing a test layer with known thickness on an entire surface area of a test substrate;
   etching the test layer of the test substrate with a plasma etching with a tilted angle;

determining test layer thickness variations of the test layer per semiconductor substrate locations after the tilted angle plasma etching;

determining overlay offset data per semiconductor substrate locations caused by the tilted angle plasma etching, wherein the overlay offset data is determined based on the determined test layer thickness variations, wherein the overlay offset data is associated with an overlay between first circuit patterns of a first layer on a semiconductor substrate and corresponding second circuit patterns of a second layer disposed over the first layer on the semiconductor substrate;

adjusting a location of the semiconductor substrate based on the overlay offset data during a lithography operation to pattern a resist layer over the second layer by projecting layout patterns of a reticle corresponding to the second circuit patterns onto the resist layer, wherein the locations of the semiconductor substrate are adjusted based on a value of the overlay offset data within a region of the semiconductor substrate where, in each projection, the layout patterns of the reticle corresponding to the second circuit patterns are projected onto the resist layer; and patterning the second layer based on the projected layout patterns of the reticle on the resist layer and using the tilted angle plasma etching.

9. The method of claim 8, wherein the tilted angle plasma etching generates non-uniform etching of the test layer on the test substrate.

10. The method of claim 8, wherein the test layer is a thin film and the test layer thickness variations is measured by a thin film thickness measurement operation.

11. The method of claim 8, wherein the tilted angle plasma etching is ion beam etching.

12. The method of claim 8, further comprising:
etching the test layer of the test substrate with tilted angle plasma etching while the test substrate is rotating with a uniform speed; and
patterning the second layer based on the projected layout patterns of the reticle on the resist layer and using the tilted angle plasma etching while the semiconductor substrate is rotating the uniform speed.

13. The method of claim 8, wherein the adjusting the location of the semiconductor substrate based on a value of the overlay offset data further comprises:
adjusting the location of the semiconductor substrate based on a median value of the overlay offset data within a region of the semiconductor substrate where, in each projection, the layout patterns of the reticle corresponding to the second circuit patterns are projected onto the resist layer.

14. The method of claim 8, the plasma etching is either:
tilting a surface of the semiconductor substrate with respect to an ion beam of the plasma etching; or
impinging, with a tilted angle, the ion beam of the plasma etching onto the semiconductor substrate.

15. A method of manufacturing a semiconductor device, comprising:
forming a target layer over a lower pattern;
obtaining information comprising etching rate variation data of a tilted angle plasma etching process with respect to the target layer;
forming a photo resist pattern over the target layer by a lithography operation;
performing the target layer by the tilted angle plasma etching process using the photo resist pattern as an etching mask,
wherein the lithography operation includes determining an overlay error offset value based on the information.

16. The method of claim 15, wherein the etching rate variation data comprises a concentric variation of etching rates within a wafer.

17. The method of claim 15, wherein the information further comprise variation data of etched shapes.

18. The method of claim 15, wherein the etching rate variation data are obtained by etched thickness variation date on a test wafer.

19. The method of claim 15, wherein the target layer is a hard mask layer.

20. The method of claim 15, wherein the lower pattern includes a conductive material.

* * * * *